United States Patent
Jacobson et al.

(10) Patent No.: US 9,530,944 B2
(45) Date of Patent: Dec. 27, 2016

(54) HIGH COLOR-SATURATION LIGHTING DEVICES WITH ENHANCED LONG WAVELENGTH ILLUMINATION

(71) Applicant: Cree, Inc., Durham, NC (US)

(72) Inventors: Benjamin A. Jacobson, Santa Barbara, CA (US); Michael Leung, Ventura, CA (US); Antony Paul van de Ven, Hong Kong (CN)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/702,564

(22) Filed: May 1, 2015

(65) Prior Publication Data

US 2016/0218254 A1     Jul. 28, 2016

Related U.S. Application Data

(60) Provisional application No. 62/108,372, filed on Jan. 27, 2015.

(51) Int. Cl.
*F21V 9/16* (2006.01)
*H01L 33/50* (2010.01)
*H01L 25/075* (2006.01)

(52) U.S. Cl.
CPC ......... *H01L 33/504* (2013.01); *H01L 25/0753* (2013.01); *F21K 9/232* (2016.08); *F21K 9/64* (2016.08); *F21Y 2115/30* (2016.08)

(58) Field of Classification Search
CPC ......... F21V 9/16; F21Y 2113/005; H01J 1/63; H05B 33/085
See application file for complete search history.

(56) References Cited

U.S. PATENT DOCUMENTS

| | | | |
|---|---|---|---|
| 6,234,648 B1 | 5/2001 | Börner et al. |
| 6,577,073 B2 | 6/2003 | Shimizu et al. |
| 6,600,175 B1 | 7/2003 | Baretz et al. |
| 7,005,679 B2 | 2/2006 | Tarsa et al. |
| 7,026,756 B2 | 4/2006 | Shimizu et al. |
| 7,497,973 B2 | 3/2009 | Radkov et al. |

(Continued)

FOREIGN PATENT DOCUMENTS

JP    2003316714 A    11/2003
JP    2009152213 A    7/2009

OTHER PUBLICATIONS

U.S. Appl. No. 14/259,993, filed Apr. 23, 2014.

(Continued)

*Primary Examiner* — Thomas L Dickey
(74) *Attorney, Agent, or Firm* — Withrow + Terranova, P.L.L.C.; Vincent K. Gustafson

(57) ABSTRACT

A lighting device including a blue solid state emitter, at least one yellow-green or green lumiphoric material, and at least one red or red-orange solid state emitter provides high color saturation, preferably in combination with a high R9-prime (modified R9) color rendering value, with such condition(s) being obtainable with at least one of (i) a red emitter peak wavelength of at least 630 nm, (ii) a green lumiphoric material having a narrow peak wavelength, and (iii) a blue shifted green color point within a specified region of a 1931 CIE chromaticity diagram, and obtainable without requiring a notch filtering material. Aggregate emissions may have a CCT in a range of from 2000K to 5000K.

40 Claims, 30 Drawing Sheets

(56) References Cited

U.S. PATENT DOCUMENTS

| | | | |
|---|---|---|---|
| 7,744,242 | B2 | 6/2010 | Krämer |
| 8,201,966 | B2 | 6/2012 | Hall et al. |
| 8,523,385 | B2 | 9/2013 | Lu et al. |
| 8,896,197 | B2 | 11/2014 | Negley et al. |
| 2004/0090787 | A1 | 5/2004 | Dowling et al. |
| 2004/0218387 | A1 | 11/2004 | Gerlach |
| 2007/0223219 | A1 | 9/2007 | Medendorp, Jr. et al. |
| 2008/0179602 | A1 | 7/2008 | Negley et al. |
| 2008/0179611 | A1 | 7/2008 | Chitnis et al. |
| 2009/0080185 | A1 | 3/2009 | McMillan |
| 2009/0184616 | A1 | 7/2009 | Van De Ven et al. |
| 2009/0207583 | A1 | 8/2009 | Takano |
| 2009/0306355 | A1 | 12/2009 | Chavez et al. |
| 2010/0140634 | A1 | 6/2010 | van de Ven et al. |
| 2010/0220471 | A1 | 9/2010 | Rooymans |
| 2010/0277907 | A1 | 11/2010 | Phipps et al. |
| 2011/0220920 | A1 | 9/2011 | Collins et al. |
| 2012/0043907 | A1 | 2/2012 | Lu et al. |
| 2012/0048327 | A1 | 3/2012 | Gore |
| 2012/0286304 | A1 | 11/2012 | LeToquin et al. |
| 2012/0306355 | A1 | 12/2012 | Seibel, II |
| 2013/0020929 | A1 | 1/2013 | van de Ven et al. |
| 2013/0038202 | A1 | 2/2013 | Donners |
| 2013/0271991 | A1 | 10/2013 | Hussell et al. |
| 2013/0329021 | A1 | 12/2013 | Fidler et al. |
| 2014/0055982 | A1 | 2/2014 | Tao et al. |
| 2014/0217433 | A1 | 8/2014 | Tudorica et al. |
| 2014/0301062 | A1* | 10/2014 | David .................. F21K 9/56 362/84 |
| 2015/0042241 | A1 | 2/2015 | Su et al. |

OTHER PUBLICATIONS

U.S. Appl. No. 14/298,327, filed Jun. 6, 2014.
Author Unknown, "Chapter 4: Lighting Design Considerations," Advanced Lighting Guidelines, 2001 Edition, New Buildings Institute, 42 pages.
Author Unknown, "LEDnovation EnhanceLite A19 LED Light Bulb Review," LED Light Review, 2012, LED-Light-Review.com, pp. 1-5.
Author Unknown, "Outdoor Lighting: Visual Efficacy," ASSIST recommends, vol. 6, Issue 2, Jan. 2009, Alliance for Solid-State Illumination Systems and Technologies (ASSIST), 14 pages.
Author Unknown, "The Language of Light," Konica Minolta Sensing Europe B.V., accessed May 21, 2014 from https://www.konicaminolta.eu/fileadmin/content/eu/Measuring_Instruments/4_Learning_Centre/L_D/The_language_of_Light/language_of_light.pdf, 32 pages.
Ashdown, I., "Mesopic Photometry and Statistics," All Things Lighting, Apr. 21, 2014, http://agi32.com/blog/category/mesopic-lightingl, 9 pages.
Deshpande, Anirudha, "New Phosphors and Blends for Blue and Violet based Remote Phosphor LED packages," GE Lumination, Phosphor Global Summit, Mar. 24, 2010, San Diego, California, General Electric, 18 pages.
Eskow, Cary, "Purity is in the eye of the beholder," Light Matters: Designing illumination systems with high-brightness LEDs, retrieved on Oct. 2, 2015, http://www.em.avnet.com/en-us/design/marketsolutions/Documents/Lighting/LightSpeed-Eskow-0709.pdf, Jan. 12, 2012, AVNET, 1 page.
Halonen, L. et al. (Eds.), "Chapter 5: Lighting technologies," Annex 45 Guidebook on Energy Efficient Electric Lighting for Buildings, 2010, Aalto University School of Science and Technology, http://www.lightinglab.fi/IEAAnnex45/guidebook/5_lighting%20technologies.pdf, 46 pages.
Kalloniatis, M., and Luu, C., "Color Perception," 2011 [retrieved on Oct. 2, 2015]. Retrieved from the Internet: <URL: http://webvision.med.utah.edu/book/part-viii-gabac-receptors/color-perception/>.
Narendran, N. et al., "Color Rendering Properties of LED Light Sources," Solid State Lighting II: Proceedings of SPIE, vol. 4776, Nov. 26, 2002, SPIE, 8 pages.
Narendran, N., "Testing LED Lighting Fixtures and Comparing Them to Traditional Lighting Fixtures," euroLED 2008 Workshop, Jun. 5, 2008, Rensselaer Polytechnic Institute, 68 pages.
Nichia Corporation, "Specifications for Warm White LED: NTCLS024B-M3," Nichia STS-DA1-3333A, Cat. No. 150223, Date Unknown, Nichia Corporation, 17 pages.
Nizamoglu, S., "Novel Nanocrystal-Integrated LEDs Utilizing Radiative and Nonradiative Energy Transfer for High-Quality Efficient Light Generation," Doctoral Thesis submitted to the Department of Electrical and Electronics Engineering and the Institute of Engineering and Sciences, Bilkent University, Mar. 2011, 243 pages.
Van Der Steen, M., "Advantages with a high S/P ratio," OliNo, Oct. 28, 2013, accessed May 21, 2014 from http://www.olino.org/us/articles/2013/10/28/advantages-with-a-high-sp-ratio, 4 pages.
Van De Ven, A. et al., "Warm White illumination with high CRI and high efficacy by combining 455nm excited yellowish phosphor LEDs and red AlInGaP LEDs," First International Conference on White LEDs and Solid State Lighting, Nov. 28, 2007, LED Lighting Fixtures, Inc., 8 pages.
Willsey, A., and Desalle, D., "Challenges of Meeting Aviation Color Requirements with LED Light Sources," Kopp Glass, Inc., Oct. 2011 [retrieved on Sep. 21, 2015]. Retrieved from the Internet: <URL: http://go.koppglass.com/meeting-aviation-color-requirements-led-light-sources>.
Non-Final Office Action for U.S. Appl. No. 14/298,327, mailed Jul. 2, 2015, 13 pages.
Non-Final Office Action for U.S. Appl. No. 14/298,327, mailed Jan. 13, 2016, 9 pages.
Notice of Allowance for U.S. Appl. No. 14/298,327, mailed Aug. 3, 2016, 9 pages.
Author Unknown, "Cadmium Free Quantum Dots," Nanoco Technologies, www.nanocotechnologies.com/what-we-do/products/cadmium-free-quantum-dots, accessed Sep. 14, 2016, Nanoco Group PLC, 2 pages.
Author Unknown, "Excellence in Color Engineering," 3M Optical Systems, accessed Sep. 14, 2016, solutions.3m.com/wps/portal/3M/en_US/NA_Optical/Systems/QDEF/, 3M, 2 pages.
Author Unknown, "Quantum Dot Technology to Join LG's 4K Ultra HD TV Line-Up in 2015," www.lg.com/uk/press-release/quantum-dot-technology-to-join-lgs-4k-ultra-hd-tv-line-up-in-2015, Dec. 17, 2014, LG Electronics, 3 pages.
Author Unknown, "Quantum Dots," Quantum Dot Pioneers, accessed Sep. 14, 2016, www.nanosysinc.com/what-we-do/quantum-dots/, Nanosys Inc., 2 pages.

\* cited by examiner

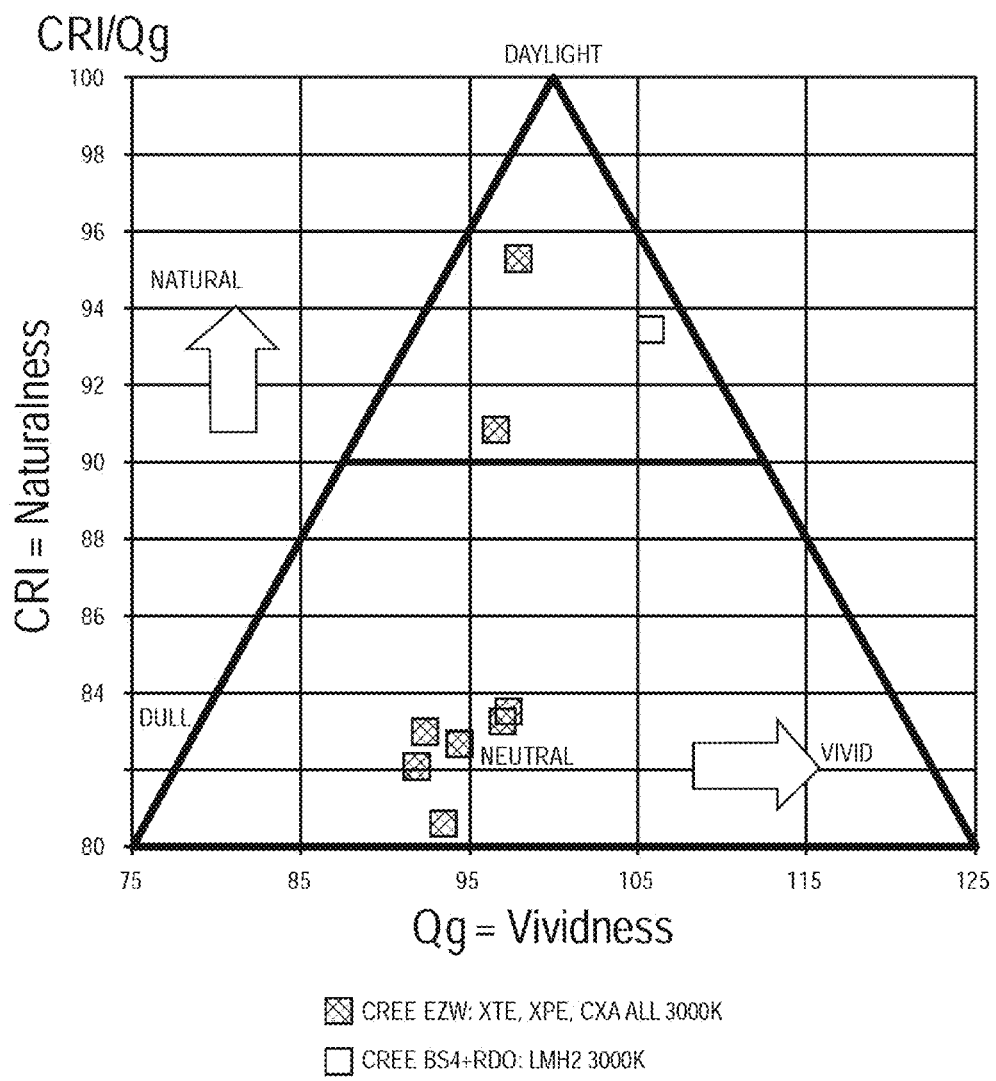
FIG._1

|  | Baseline 90CRI EZW XTE | BSY/G + 605 | BSY/G + 610 | BSY/G + 615 | BSY/G + 623 | BSY/G + 623/633 MIX | BSY/G + 633 |
|---|---|---|---|---|---|---|---|
| R9 Prime |  | -41.2 | 40.4 | 90.5 | 128.5 | 176.9 | 222.41 |
| Viv-Overall |  |  | 0.25 | 1.69 | 1.88 | 1.80 | 2.88 |
| Viv-Red |  |  | -0.56 | 0.75 | 2.00 | 2.00 | 3.19 |
| Viv-Grn |  |  |  |  |  | 1.60 |  |
| LER |  | 375.5 | 361.4 | 350.1 | 339 | 310.6 | 283.1 |
| x | 0.4344 | 0.4331 | 0.4342 | 0.4344 | 0.435 | 0.4338 | 0.4318 |
| y | 0.404 | 0.4032 | 0.4043 | 0.4039 | 0.4047 | 0.4022 | 0.4026 |
| u' | 0.249 | 0.2485 | 0.2487 | 0.249 | 0.249 | 0.2493 | 0.2479 |
| v' | 0.521 | 0.5205 | 0.5211 | 0.5209 | 0.5213 | 0.5202 | 0.52 |
| CCT: | 3043 | 3058 | 3049 | 3042 | 3038 | 3039 | 3076 |
| Duv: | 0.00032 | 0.00018 | 0.00048 | 0.0003 | 0.00051 | -0.0003 | 0.00015 |
| CRI Ra: | 90.85 | 86.38 | 91.11 | 90.36 | 85.84 | 79.35 | 72.81 |
| R9: | 55.3 | -41.2 | 40.4 | 90.5 | 69.8 | 19.7 | -32.8 |
| R9 Prime | 55.3 | -41.2 | 40.4 | 90.5 | 128.5 | ~175 | 222.41 |
| CQS Qa: | 90.6 | 83.9 | 90.9 | 91.2 | 90.5 | 88.9 | 85.9 |
| CQS Qf: | 90.7 | 84 | 89.4 | 88.5 | 86.7 | 82.8 | 78.4 |
| CQS Qg: | 96.5 | 96.8 | 104 | 108.4 | 111 | 115.6 | 119 |
| Blue pk | 455 | 446 | 446 | 447 | 447 | 446 | 446 |
| Red pk | 618 | 612 | 619 | 623 | 627 | 642 | 643 |
| Va | 96.3 | 95 | 101.5 | 105.4 | 107.9 | 111.9 | 115.1 |

*FIG. 2A*

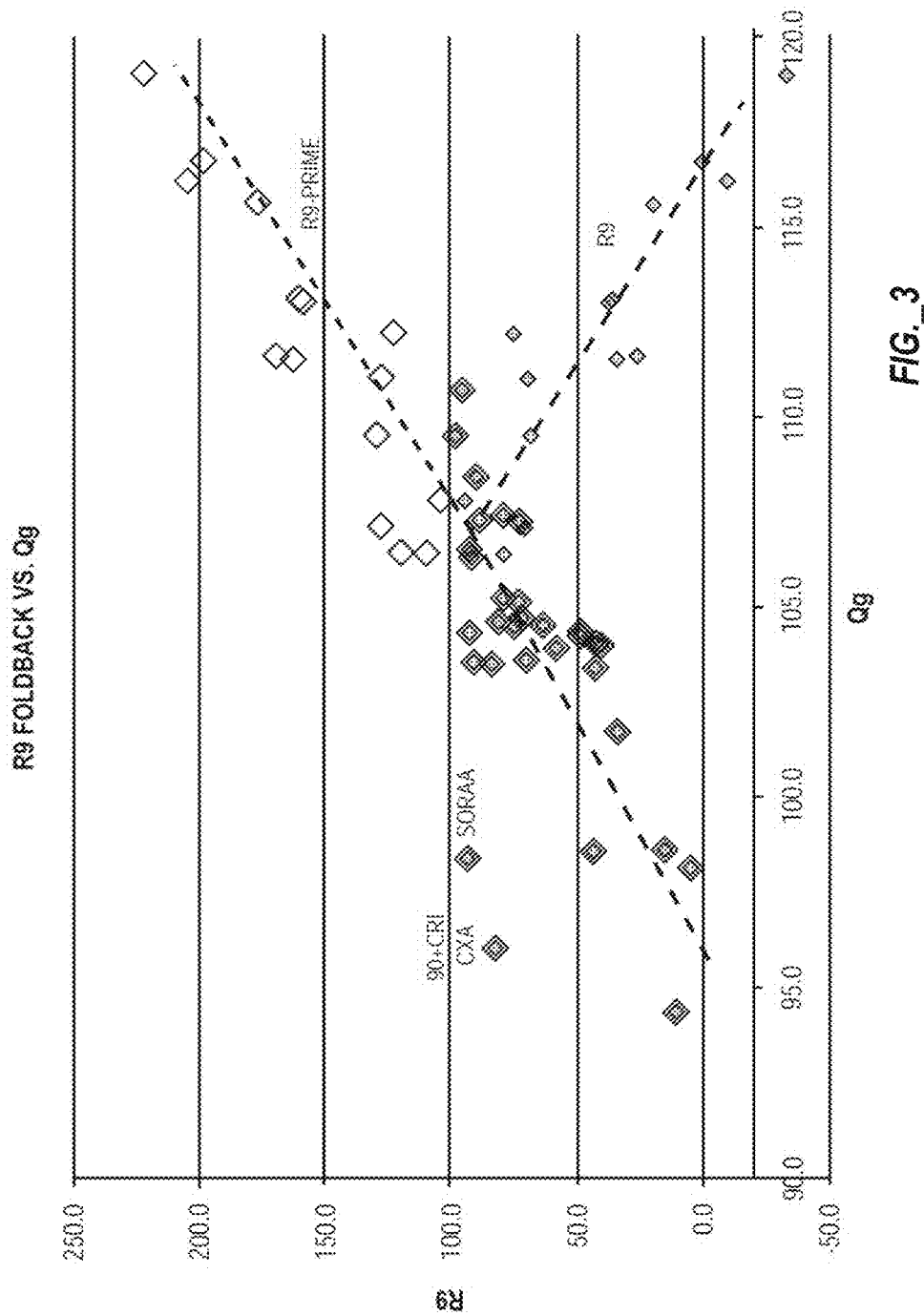
FIG._3

FIG. _4A
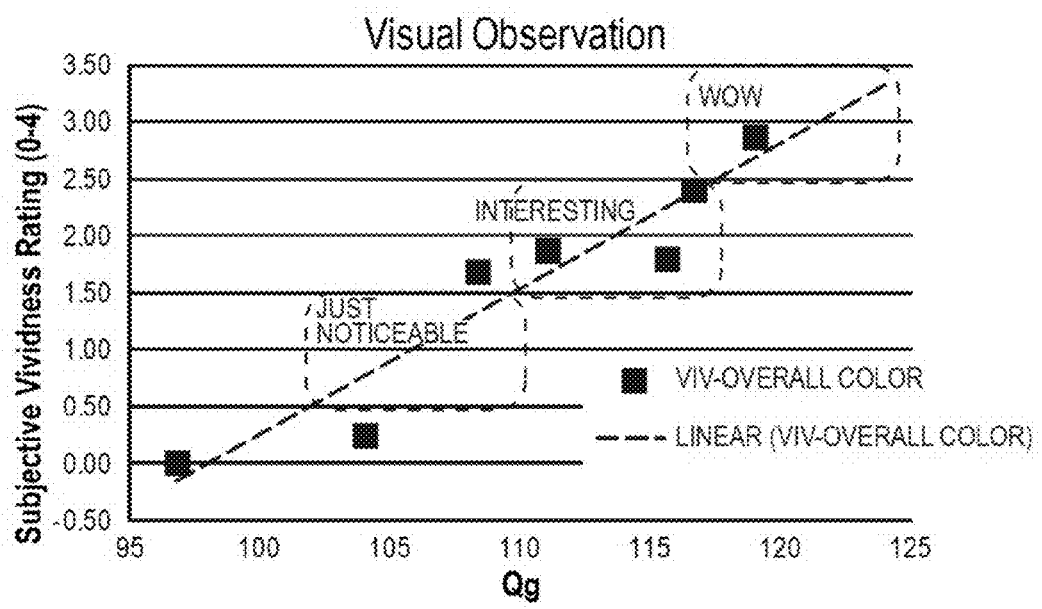
FIG. _4B
FIG. _4C

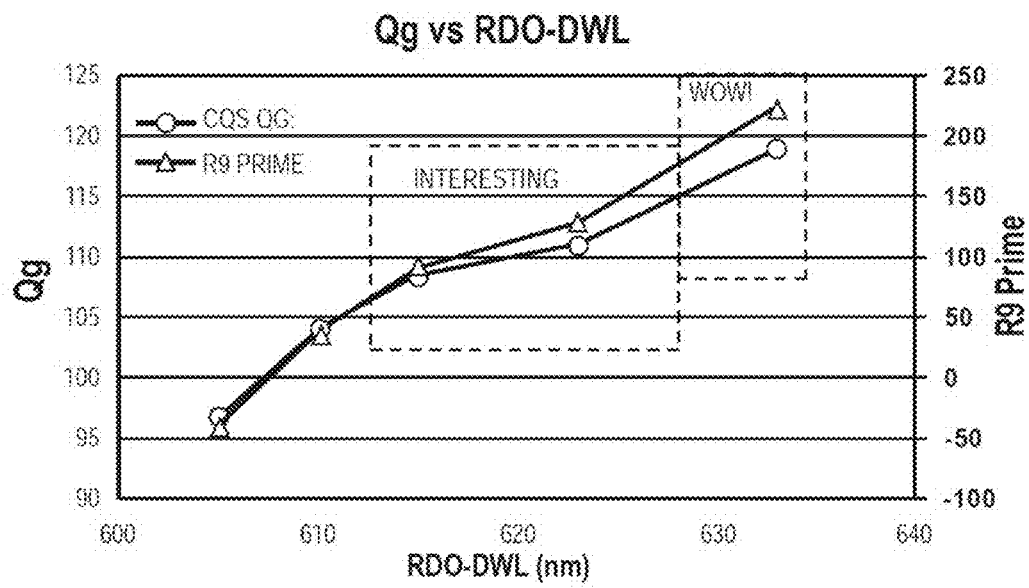
FIG._5A
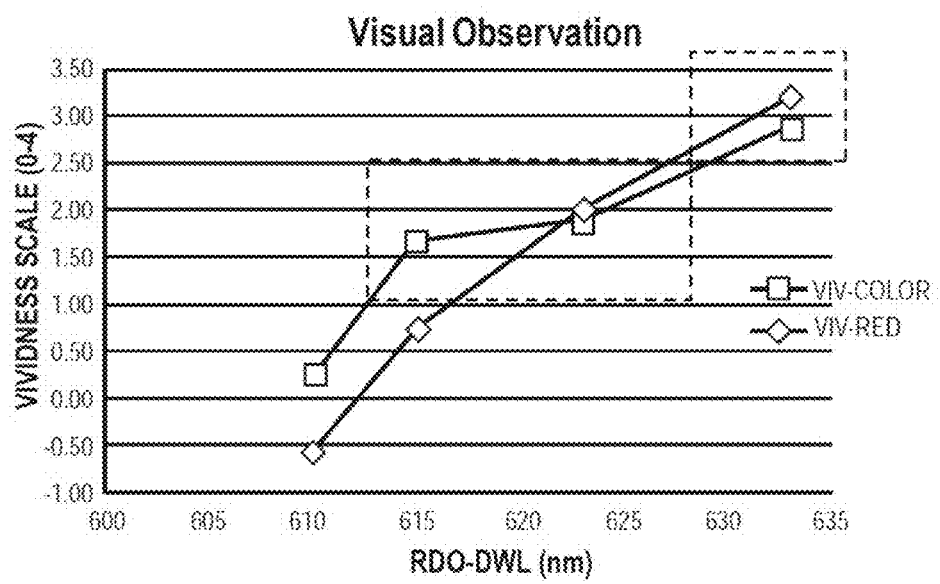
FIG._5B

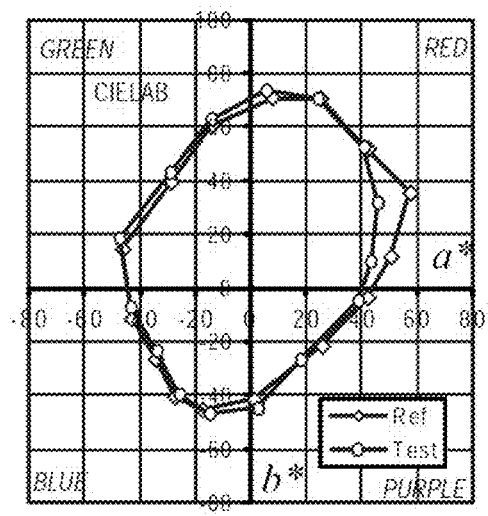
FIG._6A
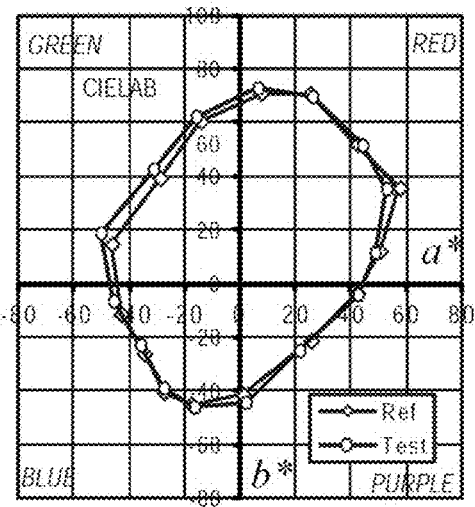
FIG._6B
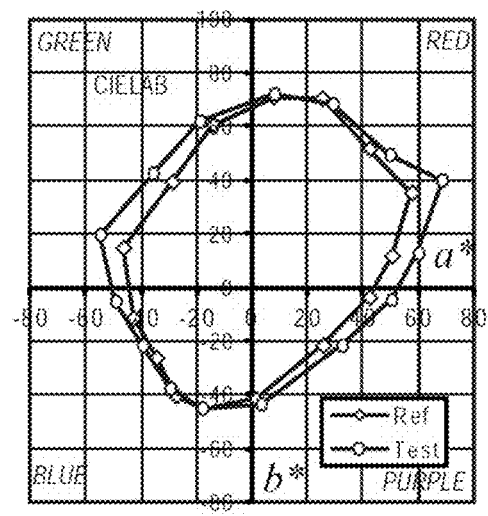
FIG._6C

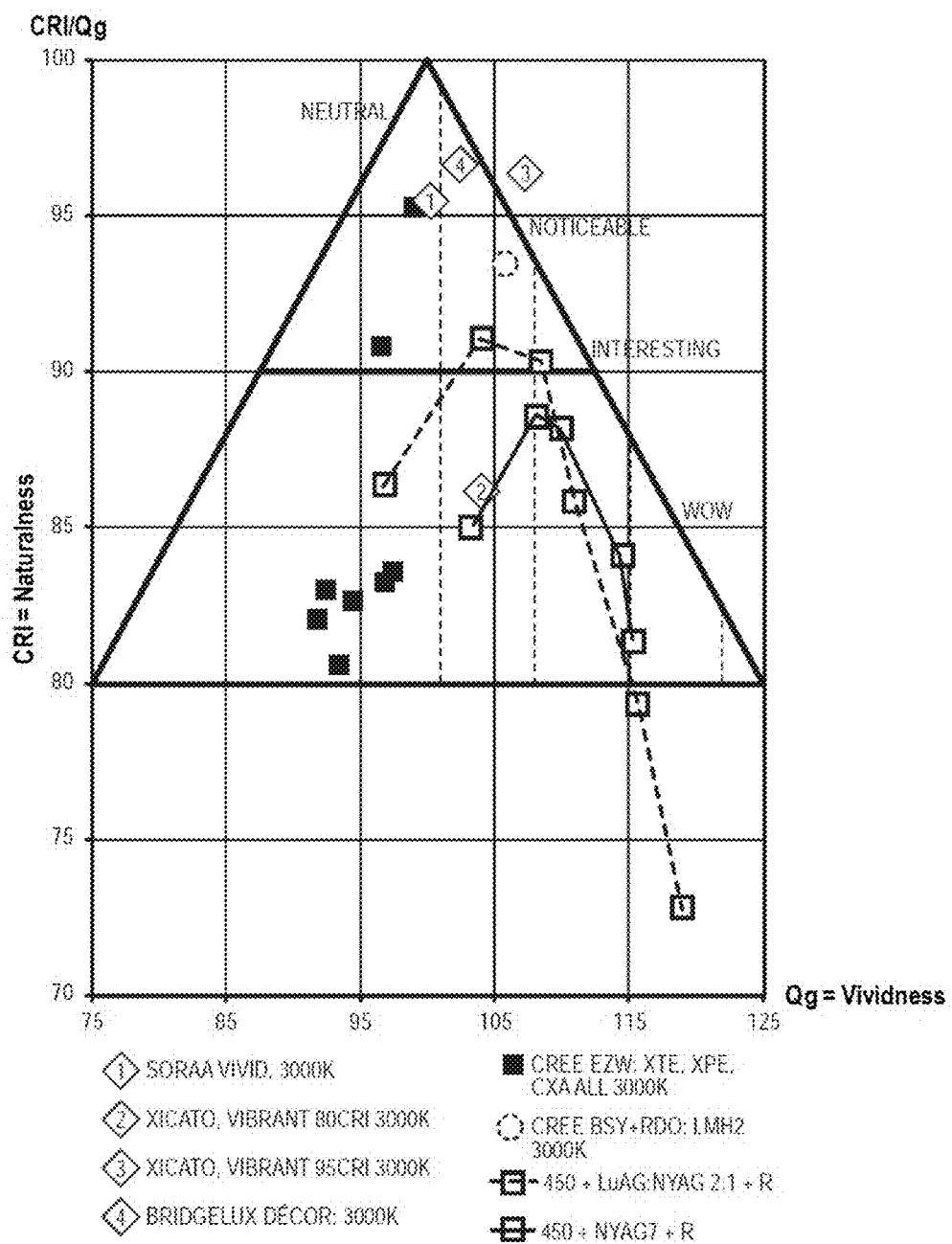
FIG._7

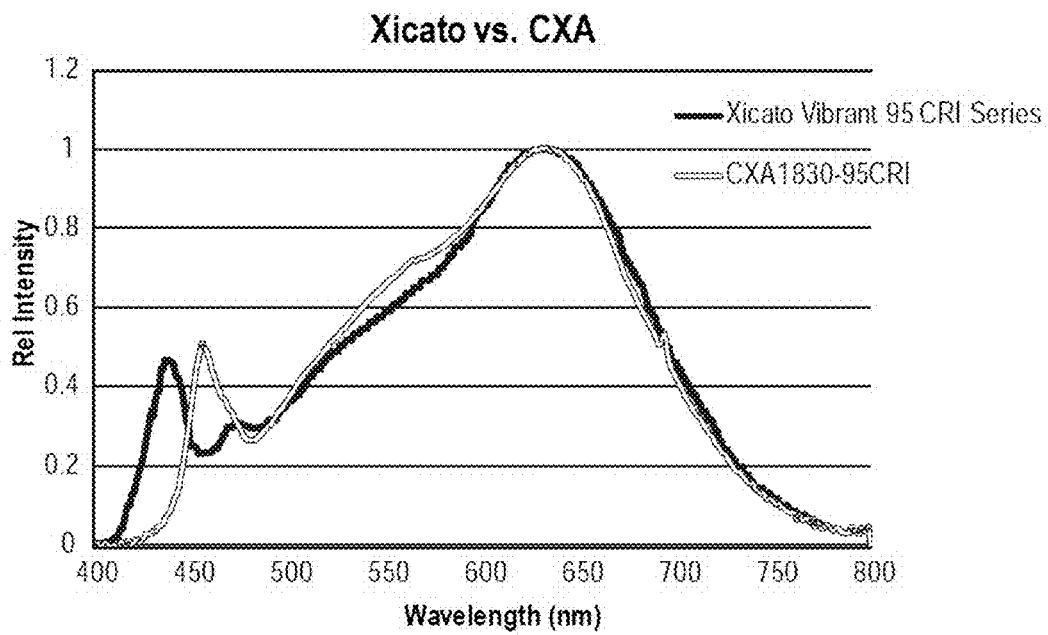
|  | CRI | Qg | PCB LPW | System LPW |
|---|---|---|---|---|
| XTE 90CRI | 91 | 97 | 97 |  |
| XTE 80CRI | 81-83 | 92-97 | 110 |  |
| Soraa Vivid | 96 | 100 |  | 55 |
| Xicato Vibrant 80CRI | 86 | 104 | 89 |  |
| Xicato Vibrant 95CRI | 96 | 107 | 57 |  |
| Bridgelux Decor | 97 | 102 | 82 |  |
| BSY+R: LMH2 | 93 | 106 |  | 103 |
| BSY + R 3000K SBTC POR | 93 | 100 | 129 |  |
| BSY/G + 615 | 91 | 109 | 131 |  |
| BSY/G + 628 | 83 | 115 | 117 |  |
| BSY/G + 633 | 73 | 119 | 103 |  |
FIG._8
FIG._11

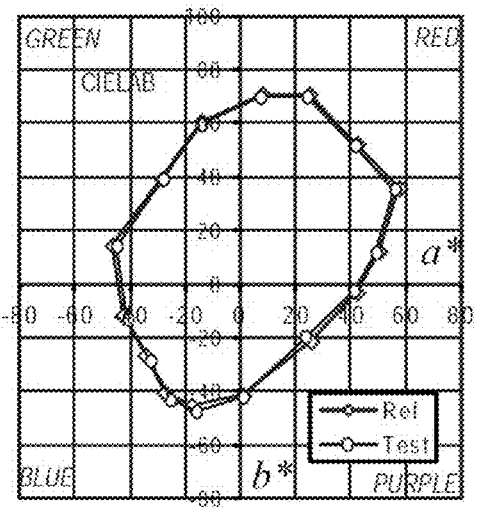
FIG._9A
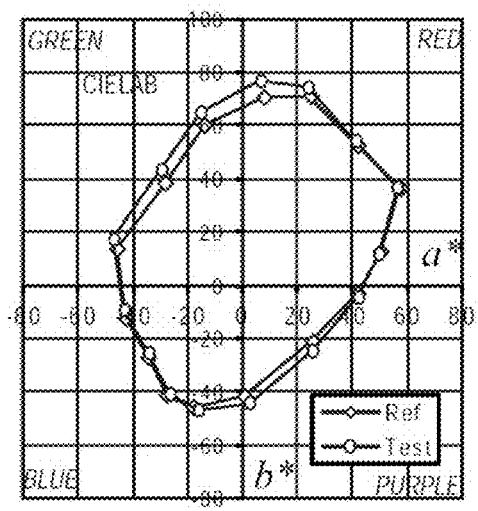
FIG._10A
|  | Cree CXA1830-3000K 95CRI |
|---|---|
| Calc. CCT (K) | 3021 |
| duv | 0.00224 |
| CRI Ra | 95.29 |
| CRI R9 | 79.7 |
| LER (lm/W) | 274.3 |
| CQS Qa | 94.1 |
| CQS Qf | 94.2 |
| CQS Qg | 96.4 |
FIG._9B
|  | Xicato Vibrant 95CRI |
|---|---|
| Calc. CCT (K) | 2928 |
| duv | -0.0069 |
| CRI Ra | 96.4 |
| CRI R9 | 89.5 |
| LER (lm/W) | 254.9 |
| CQS Qa | 93.5 |
| CQS Qf | 89.8 |
| CQS Qg | 107.2 |
FIG._10B

| | LuAG/NYAG +623nm | LuAG/NYAG +628nm |
|---|---|---|
| LER | 339 | 309.9 |
| S:P ratio | 1.48 | 1.51 |
| Lm (lux) | 46398.76 | 45935.05 |
| Sc. Lm | 68489.51 | 69340.95 |
| Rf | 3.5948 | 3.5948 |
| x | 0.435 | 0.4328 |
| y | 0.4047 | 0.4026 |
| u' | 0.249 | 0.2486 |
| v' | 0.5213 | 0.5202 |
| CCT: | 3038 | 3058 |
| Duv: | 0.00051 | 0 |
| CRI Ra: | 85.84 | 76.98 |
| R9: | 69.8 | 0.5 |
| CQS Qa: | 90.5 | 88.3 |
| CQS Qf: | 86.7 | 81.3 |
| CQS Qg: | 111 | 116.7 |
| Blue pk | 447 | 447 |
| Red pk | 627 | 636 |
| Va | 107.9 | 113 |
| Visual | Interesting | Wow |
FIG._12A
| | NYAG +623nm | NYAG +628nm |
|---|---|---|
| LER | 347.5 | 323.1 |
| S:P ratio | 1.32 | 1.32 |
| Lm (lux) | 46114.33 | 44762.28 |
| Sc. Lm | 60644.35 | 59219.55 |
| Rf | 3.5948 | 3.5948 |
| x | 0.4317 | 0.4338 |
| y | 0.4027 | 0.4008 |
| u' | 0.2478 | 0.2498 |
| v' | 0.5201 | 0.5196 |
| CCT: | 3079 | 3030 |
| Duv: | 0.0002 | -0.00086 |
| CRI Ra: | 88.24 | 84.12 |
| R9: | 81.2 | 60.9 |
| CQS Qa: | 85.4 | 85.8 |
| CQS Qf: | 81.9 | 80.5 |
| CQS Qg: | 108.9 | 114.5 |
| Blue pk | 444 | 444 |
| Red pk | 627 | 636 |
| Va | 104 | 108.5 |
| Estimate | Interesting | Wow |
FIG._12B
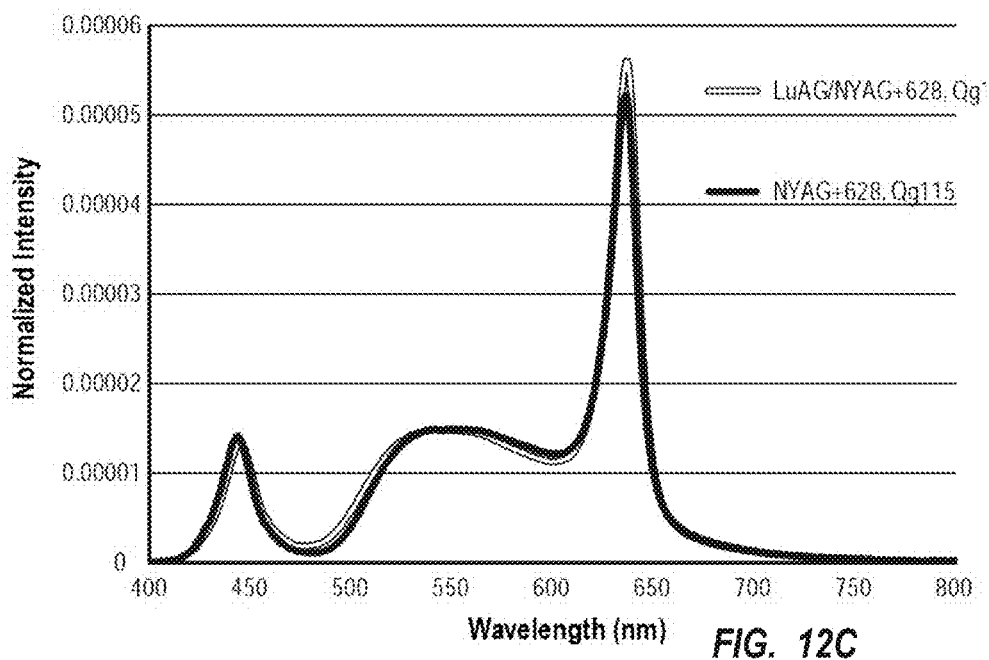
FIG._12C

|  | BSY/G+R Qg115 | CXA-BSY-RDO | NYAG+628 | BSY/G+R Qg117 | BSY/G+R Qg119 |
|---|---|---|---|---|---|
| Red Dom | 628 | 633 | 628 | 628 | 633 |
| R9 Prime | 176.9 |  |  | 194.9 | 222.41 |
| Viv-Overall Color | 1.80 | 1.90 |  | 2.40 | 2.88 |
| Viv-Red | 2.00 | 2.20 |  | 2.90 | 3.19 |
| Viv-Grn | 1.60 | 1.20 |  | 1.90 |  |
| LER | 310.6 | 310.2 | 323.1 | 309.9 | 283.1 |
| S:P ratio | 1.5 | 1.33 | 1.32 | 1.51 | 1.52 |
| Lm (lux) | 46614.49 | 70680.93 | 44762.28 | 45935.05 | 46389.11 |
| Sc. Lm | 69860 | 94046.25 | 59219.55 | 69340.95 | 70701.47 |
| Rf | 3.5948 | 3.5948 | 3.5948 | 3.5948 | 3.5948 |
| x | 0.4338 | 0.4357 | 0.4336 | 0.4328 | 0.4318 |
| y | 0.4022 | 0.4023 | 0.4008 | 0.4026 | 0.4026 |
| u' | 0.2493 | 0.2506 | 0.2498 | 0.2486 | 0.2479 |
| v' | 0.5202 | 0.5205 | 0.5196 | 0.5202 | 0.52 |
| CCT: | 3039 | 3006 | 3030 | 3058 | 3076 |
| Duv: | -0.0003 | -0.00055 | -0.00086 | 0 | 0.00015 |
| CRI Ra: | 79.35 | 86.23 | 84.12 | 76.98 | 72.81 |
| R9: | 19.7 | 58.4 | 60.9 | 0.5 | -32.8 |
| CQS Qa: | 88.9 | 88.2 | 85.8 | 88.3 | 85.9 |
| CQS Qf: | 82.8 | 83.8 | 80.5 | 81.3 | 78.4 |
| CQS Qg: | 115.6 | 112 | 114.5 | 116.7 | 119 |
| Blue pk | 446 | 451 | 444 | 447 | 446 |
| Red pk | 642 | 642 | 636 | 636 | 643 |

FIG._13

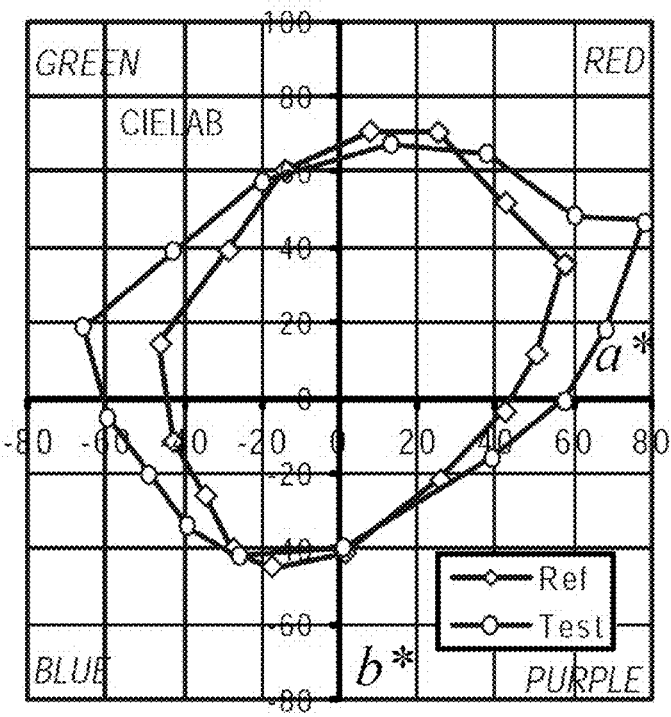
FIG._14A
FIG._14B
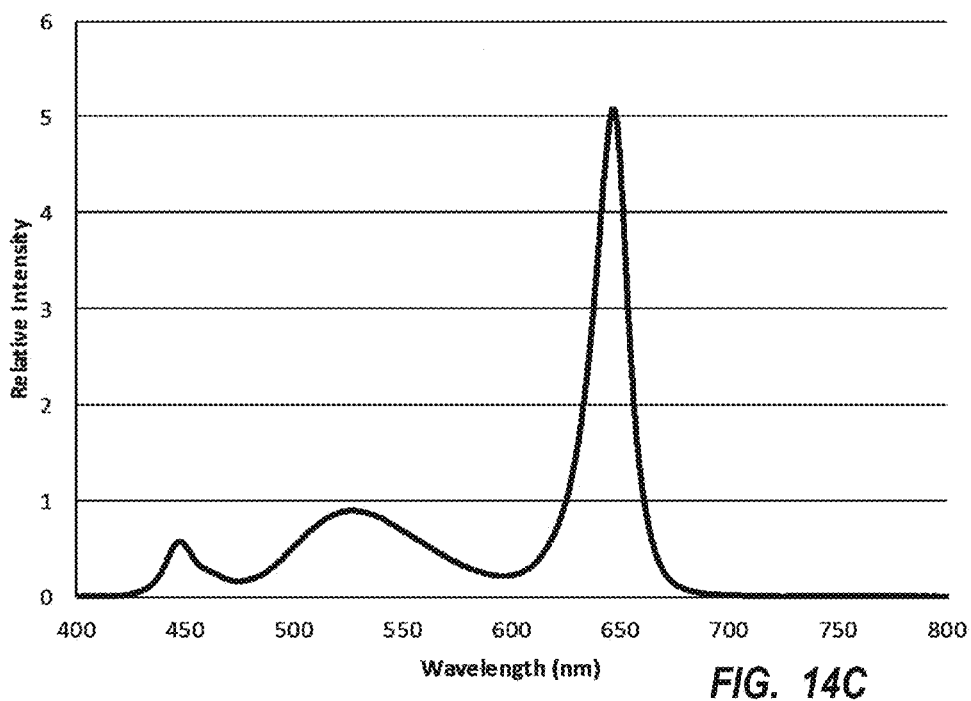
FIG._14C

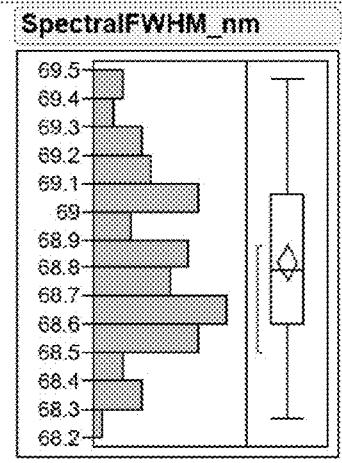
*FIG._15A*
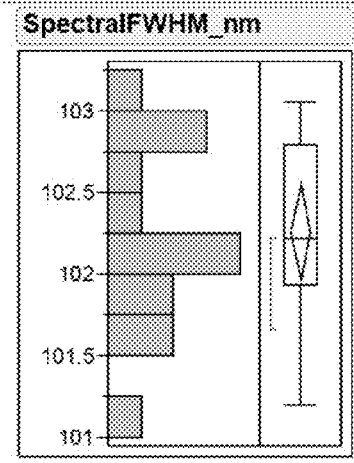
*FIG._15B*
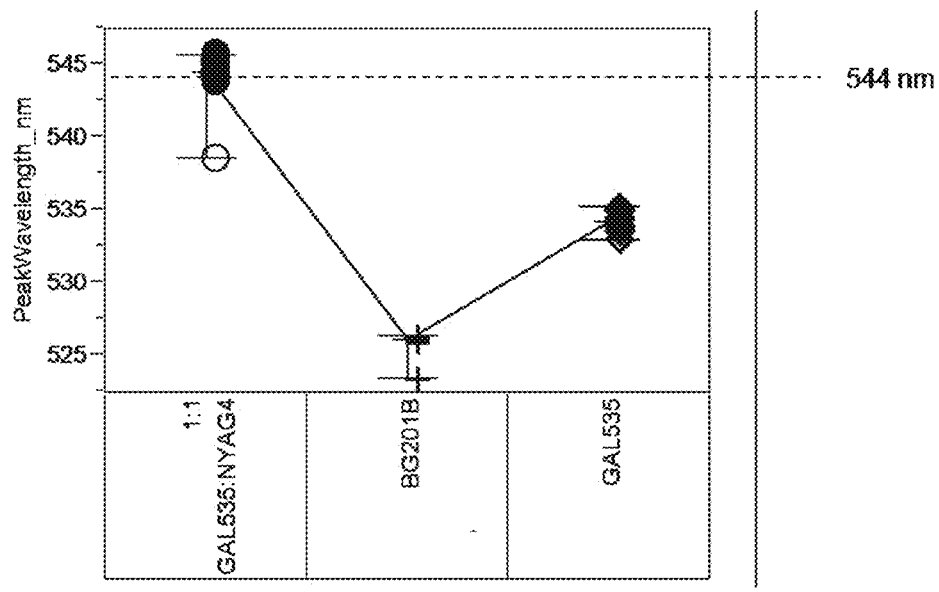
*FIG._15C*

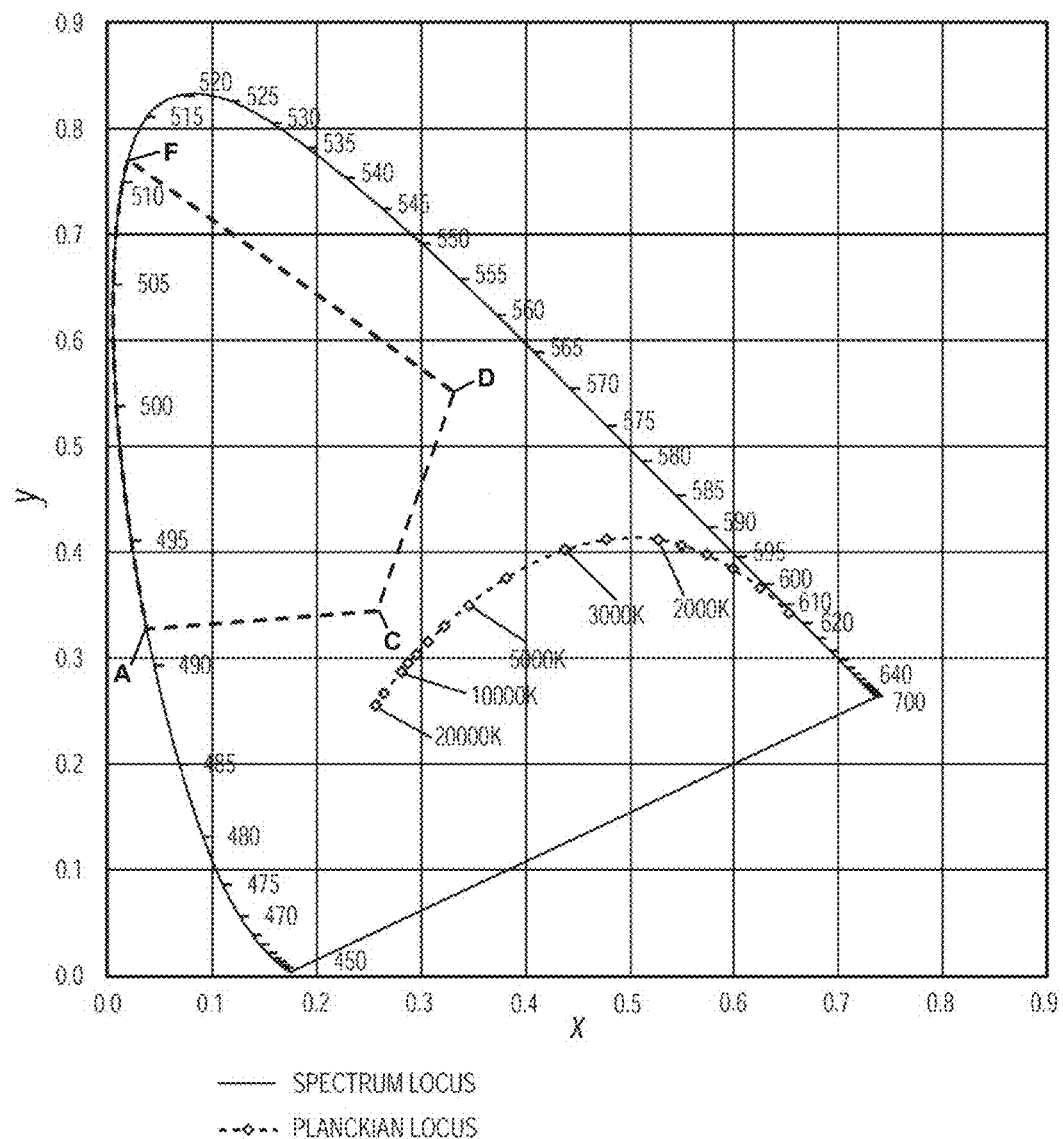
FIG._17

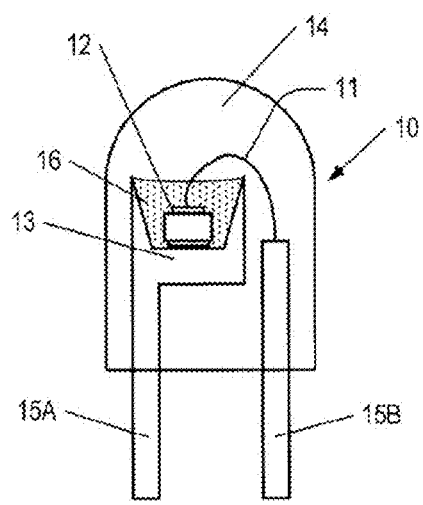
*FIG._18A*
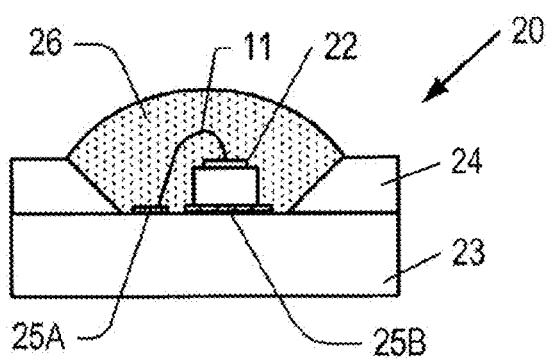
*FIG._18B*
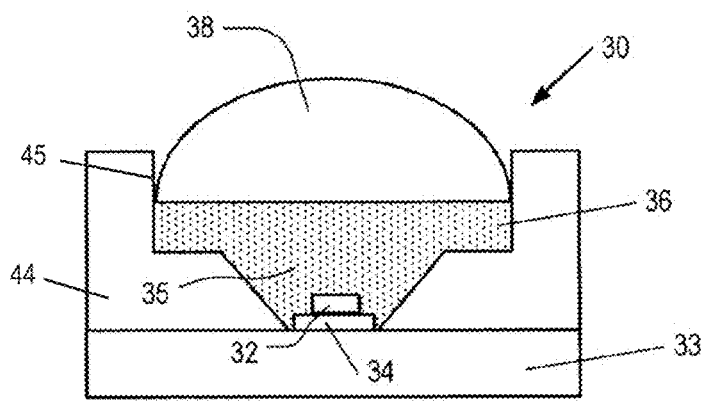
*FIG._18C*

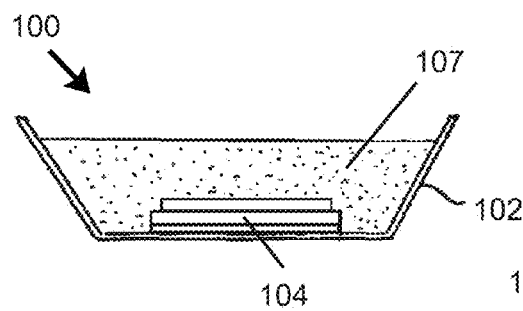
FIG._19A
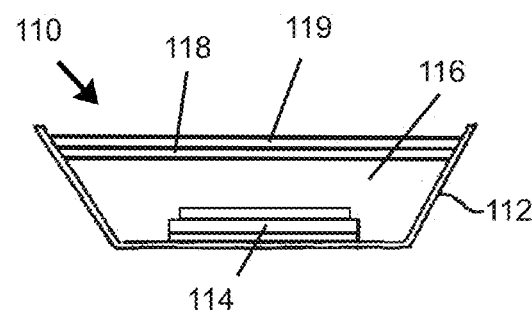
FIG._19B
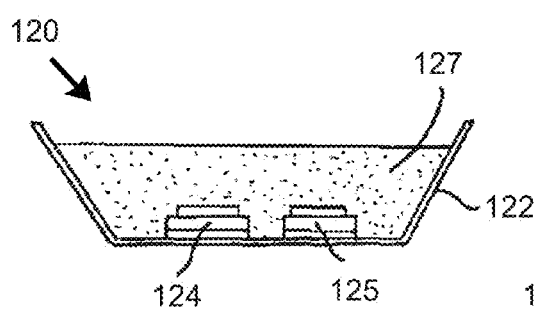
FIG._19C
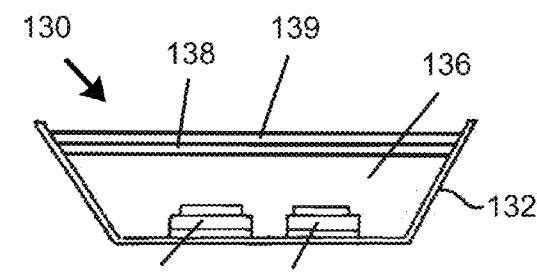
FIG._19D
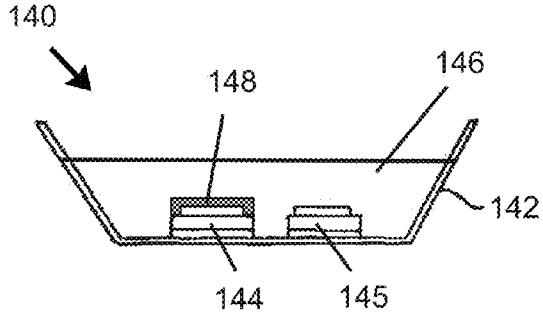
FIG._19E

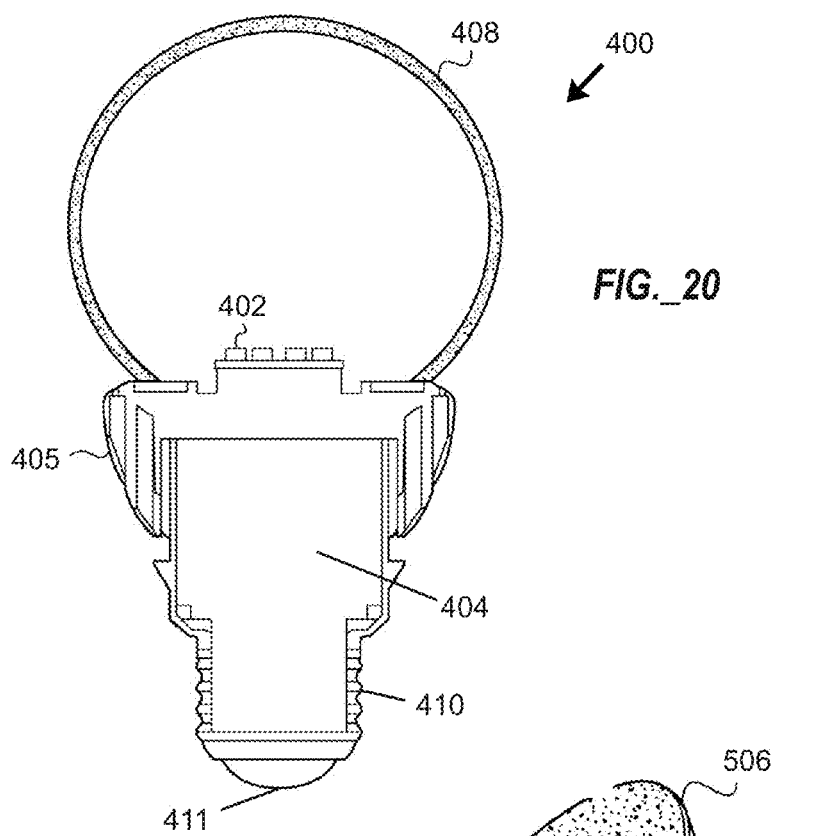
FIG._20
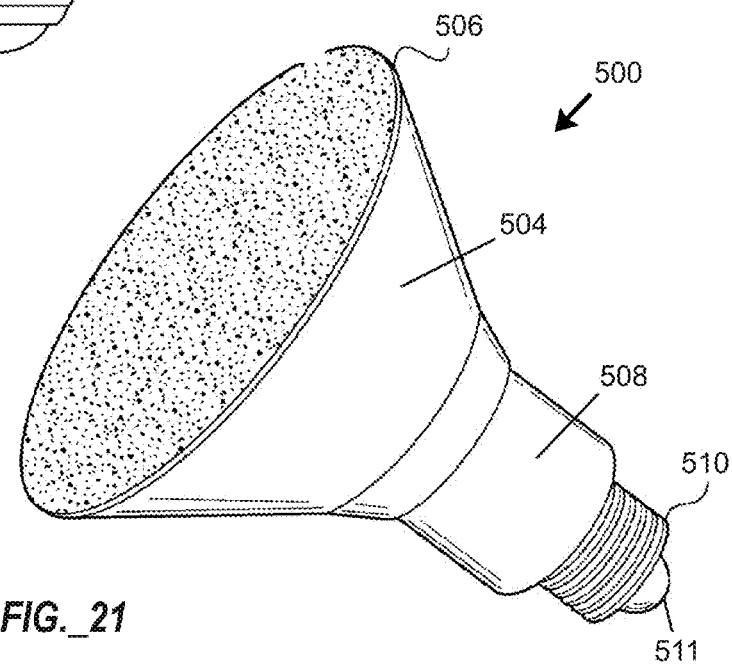
FIG._21

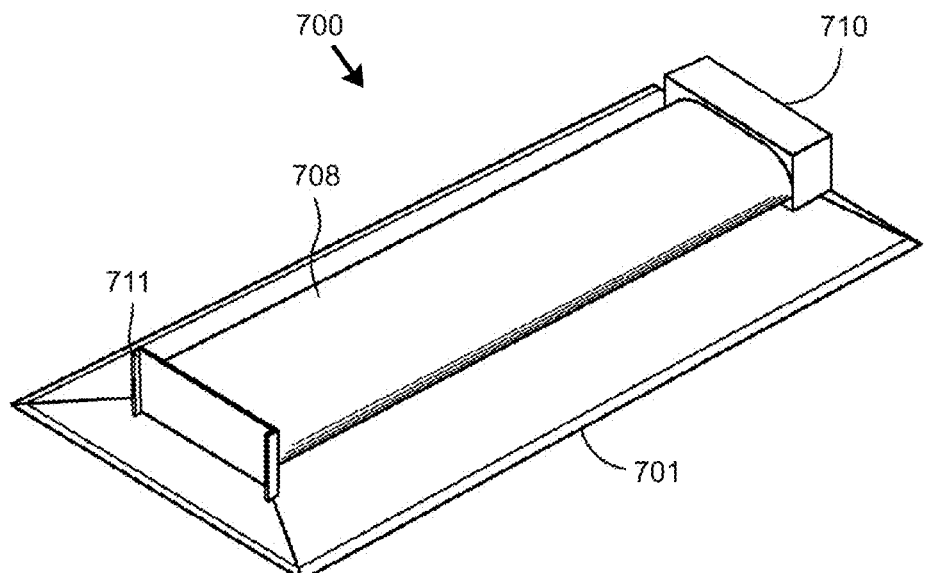
FIG._22A
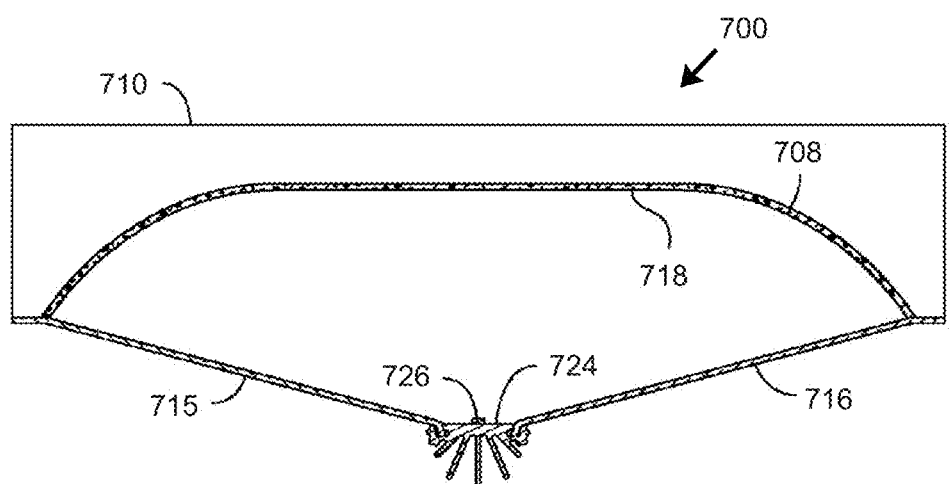
FIG._22B

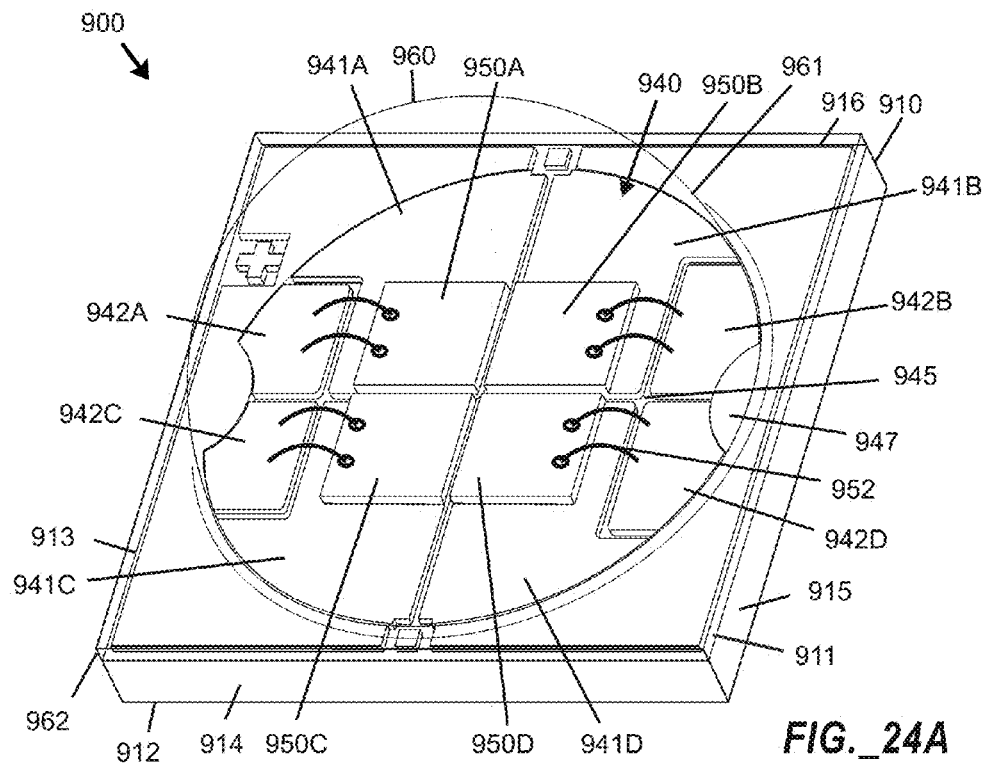
FIG._24A
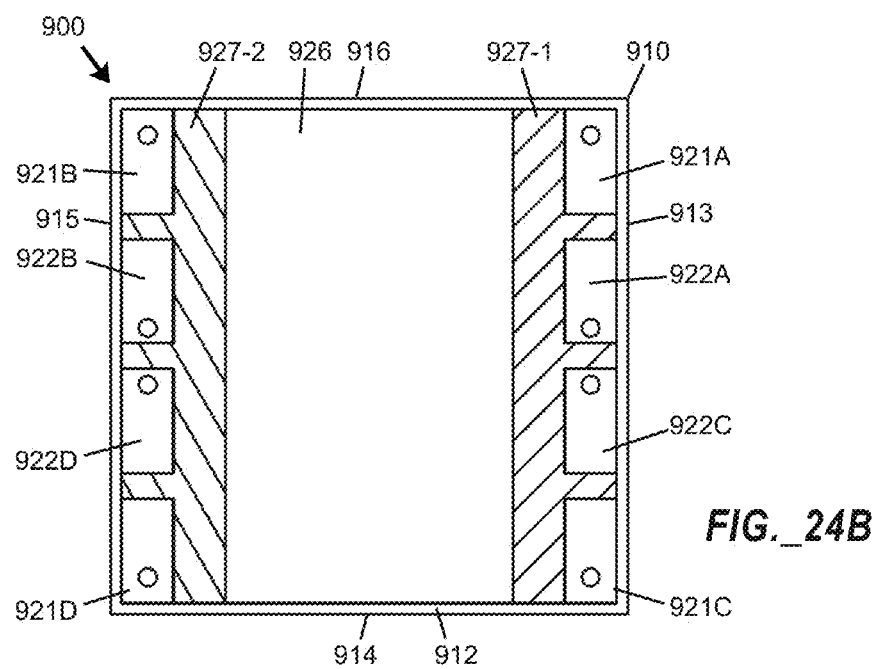
FIG._24B

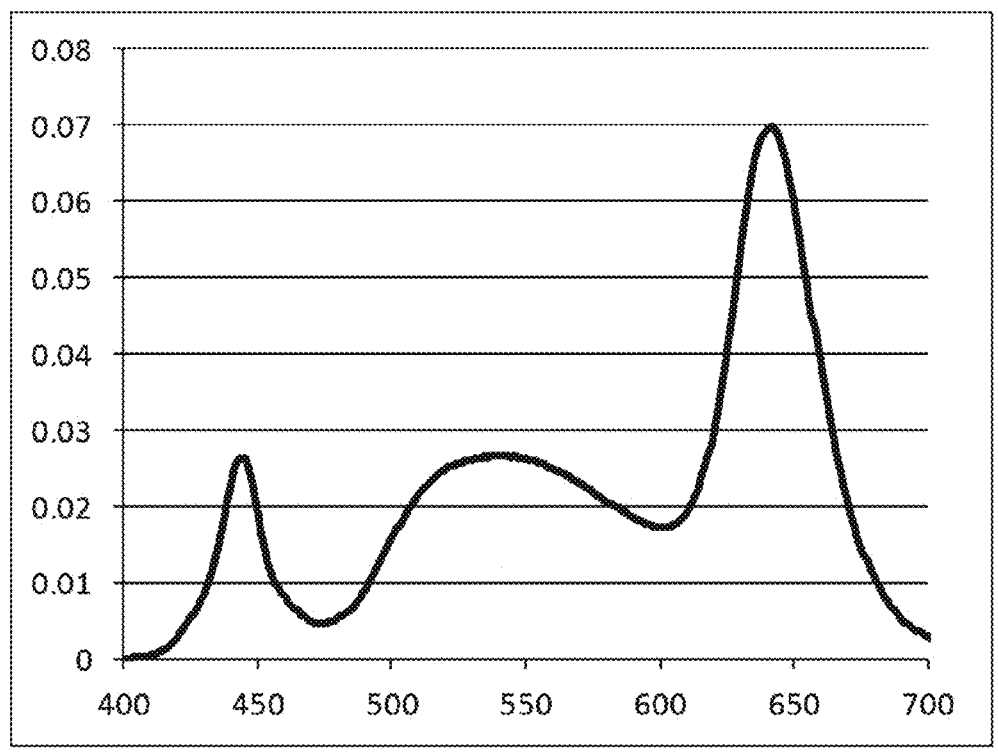
FIG. _27
| CCT | Red Peak | Qg | CRI |
|---|---|---|---|
| 3000 | 626 | 111.5 | 86 |
|  | 631 | 114.4 | 81 |
|  | 633 | 115.4 | 79 |
|  | 635 | 116.4 | 77.5 |
|  | 637 | 117.4 | 76 |
|  | 639 | 118.2 | 74 |
| 4000 | 626 | 110.3 | 88.5 |
|  | 631 | 111.1 | 86 |
|  | 635 | 112.6 | 84 |
|  | 639 | 114 | 82 |
|  | 641 | 114.7 | 81 |
|  | 643 | 115.3 | 80 |
|  | 646 | 116.1 | 78.2 |
|  | 650 | 117.4 | 76 |
FIG. _28

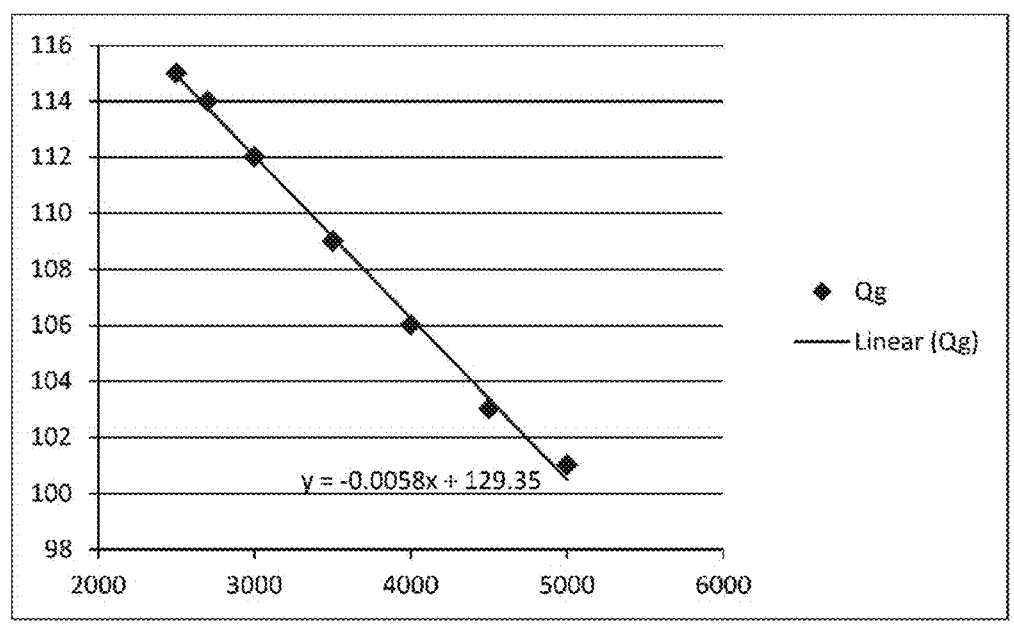

HIGH COLOR-SATURATION LIGHTING DEVICES WITH ENHANCED LONG WAVELENGTH ILLUMINATION

CROSS-REFERENCE TO RELATED APPLICATION(S)

This application claims priority to U.S. Provisional Patent Application No. 62/108,372 filed on Jan. 27, 2015, with the entire content of the foregoing provisional patent application being hereby incorporated by reference as if fully set forth herein.

FIELD OF THE DISCLOSURE

The present disclosure relates to solid state lighting devices, including devices with lumiphors arranged to be stimulated by electrically activated solid state emitters, and relates to associated methods of making and using such devices.

BACKGROUND

Solid state emitters such as light emitting diodes (LEDs) are widely used in consumer and commercial applications. Continued developments in LED technology have resulted in highly efficient and mechanically robust light sources arranged to output emissions in the visible spectrum and beyond. These attributes, coupled with the long service life of solid state devices, have enabled a variety of new display applications, and have resulted in use of LEDs in general illumination applications with the potential to replace incandescent and fluorescent lamps.

Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue LED and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or UV LED source.

Emissions of a blue LED in combination with a yellow or green lumiphoric material may be near-white in character and referred to as "blue-shifted yellow" ("BSY") light or "blue-shifted green" ("BSG") light. Addition of red (or red-orange) spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Solid state emitters such as LEDs in combination with lumiphors create white light by mixing relatively narrow wavelength bands together with spectral gaps between peaks of LEDs and/or lumiphors. The resulting light may be under-saturated with certain colors of the spectrum or over-saturated with certain colors.

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which are pastel colored with low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight and blackbody sources are superior to many artificial light sources for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a GAI of approximately 50% (i.e., about half the gamut area of the EES source). Sources with higher CCT values have a larger GAI. For example, a very bluish light with a CCT of 10000K may have a GAI of 140%.

Another way of characterizing how saturated an illuminant makes objects appear is relative gamut area, or "Qg" (also referred to as "Color Quality Scale Qg" or "CQS Qg"), which is the area formed by (a*, b*) coordinates of the 15 test-color samples in CIELAB normalized by the gamut area of a reference illuminant at the same CCT and multiplied by 100. In a manner similar to GAI, Qg values can exceed 100;

however, Qg values are scaled for consistency relative to CCT. Because of chromatic adaptation, and because CCT is selected to set the overall color tone of an environment as part of the lighting design process, variable-reference measures such as Qg may be especially relevant to applied lighting design. If the relative gamut is greater than that of the reference, and illuminance is lower than that provided by daylight, then an increase in preference and discrimination might be expected relative to the reference at that same CCT. Conversely, if the relative gamut is smaller than that of the reference, then a decrease in preference and discrimination might be expected relative to the reference at the same CCT.

It is believed that, in at least certain contexts, some consumers may prefer light sources with significantly enhanced vividness.

One way to increase GAI and Qg of lighting devices (including solid state lighting devices) is through use of a notch filtering material, which is a material that affects passage of light to cause light exiting the material to exhibit a spectral notch. A spectral notch is a portion of the color spectrum where the light is attenuated, thus forming a "notch" when light intensity is plotted against wavelength. Arrangement of a notch filtering material on or in a light transmissive surface of a lighting device will inherently entail at least some attenuation of light and concomitant reduction of luminous efficacy, and may also increase need for heat dissipating structures (e.g., heatsinks) since notch filtering materials are subject to being heated by absorbed photons. It may be challenging to provide enhanced vividness in combination with high luminous efficacy, and further in combination with reasonably high color rendering index values. High saturation of red color may also be desirable.

The art continues to seek improved solid state lighting devices providing desirable illumination characteristics capable of overcoming challenges associated with conventional lighting devices.

SUMMARY

The present disclosure relates to a lighting device and lighting method capable of providing light with enhanced vividness (e.g., high Qg), in combination with at least moderately high luminous efficacy (e.g., lumens per watt), with further capability to promote high to very high saturation of red color. Very high saturation of red color may be quantified by a high "R9-prime" color rendering value (e.g., R9-prime exceeding 100 or another threshold specified herein), with R9-prime representing a modified R9 color rendering regime in which values above 100 may be obtained. Enhanced vividness (e.g., Qg and/or Qg in combination with R9-prime) may be obtained, for example, with at least one of (i) a red emitter peak wavelength of at least 630 nm, (ii) a green or yellow lumiphoric material having a narrow peak wavelength, and (iii) a blue-shifted green color point within a specified region of a 1931 CIE chromaticity diagram.

In one aspect, the present disclosure relates to a lighting device comprising at least one first electrically activated solid state emitter arranged to generate first emissions comprising a dominant wavelength in a blue range; at least one lumiphoric material arranged to receive at least a portion of the first emissions and produce lumiphor emissions comprising a dominant wavelength in a green or yellow range; and at least one second electrically activated solid state emitter arranged to generate second emissions comprising a dominant wavelength in a red or red-orange range; wherein aggregate emissions of the lighting device include at least a portion of the first emissions, at least a portion of the lumiphor emissions, and at least a portion of the second emissions; wherein said aggregate emissions comprise a correlated color temperature (CCT) value, and prior to passage through any optionally present notch filtering element arranged to at least partially inhibit transmission of said aggregate emissions, said aggregate emissions comprise a relative gamut area (Qg) value of at least the value obtained by the equation 121 minus the product of 0.003 times the CCT value; and wherein the lighting device comprises at least one of the following features (a) to (e): (a) the at least one second electrically activated solid state emitter comprises a peak wavelength of at least 630 nm; (b) the at least one lumiphoric material comprises a lumiphor arranged to produce lumiphor emissions having a peak wavelength in a range of from 510 nm to 570 nm (or from 510 nm to 544 nm) and having a full width-half maximum intensity of less than 90 nm; (c) a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.257, 0.345), a second line having x, y endpoint coordinates of (0.257, 0.345) and (0.332, 0.551), a third line having x, y endpoint coordinates of (0.332, 0.551) and (0.020, 0.770), and a curve corresponding to a portion of the spectrum locus having x, y endpoint coordinates of (0.020, 0.770) and (0.040, 0.329); (d) said aggregate emissions comprise a R9-prime color rendering value that is greater than 110; and (e) said aggregate emissions comprise a R9-prime color rendering value that is at least the value obtained by the equation (9 times the Qg value) minus 873, wherein the R9-prime color rendering value is also greater than 100. In certain embodiments, two, three, four or more of more of features (a) to (e) may be present.

In certain embodiments, the lighting device is devoid of a notch filtering element arranged to at least partially inhibit transmission of said aggregate emissions. In certain embodiments, said aggregate emissions comprise a correlated color temperature (CCT) value in a range of from 2000K to 6500K, from 2000K to 5000K, from 2500K to 5000K, or within another range specified herein. In certain embodiments, said aggregate emissions comprise a Qg value of at least 115, at least 119, or another value specified herein. In certain embodiments, said aggregate emissions comprise a R9-prime color rendering value of at least 125, or at least 175, of at least 200, or another threshold (or within another range) specified herein. In certain embodiments, said aggregate emissions comprise a color point within a 5-step MacAdam ellipse of the blackbody locus on a 1931 CIE Chromaticity Diagram. In certain embodiments, said aggregate emissions comprise a color point within 0.003 delta u'v' from the blackbody locus. In certain embodiments, said first emissions comprise a peak wavelength not exceeding 465 nm (such as in a range of from 440 nm to 465 nm, or in a subrange of from 447 nm to 455 nm, or in a subrange of not exceeding 455 nm, and/or said second emissions comprise a peak wavelength in a yellow or green range of from 510 nm to 570 nm (or in a green range of from 510 nm to 544 nm). In certain embodiments, said aggregate emissions comprise a CRI in a range of from 70 to 85, a range of less than or equal to 80, or another range specified herein. In certain embodiments, said aggregate emissions comprise a luminous efficacy in a range of at least 80 lumens per watt, at least 95 lumens per watt, or another range specified herein. In certain embodiments, the at least one lumiphoric material may include a first lumiphoric material including at least one of lutetium aluminum garnet (LuAG) and green aluminate (GAL) material, and a second lumiphoric material including cerium(III)-doped yttrium aluminum garnet (Ce:YAG), wherein a proportion of the first lumiphoric material to the second lumiphoric material is at least 1:1; at least 1.5:1; at least 2:1; or within another range specified herein. In certain embodiments, multiple first electrically activated (e.g., blue) solid state emitters and multiple second electrically activated (e.g., red or red-orange) solid state emitters may be provided. In certain embodiments, multiple clusters of solid state emitters may be provided, wherein each cluster includes at least one first solid state emitter and at least one second solid state emitter. In certain embodiments, the lighting device may be devoid of any "unconverted" blue LED not arranged to stimulate a lumiphoric material. In certain embodiments, the lighting device may be devoid of any incandescent light emitting element and devoid of any notch filtering element.

In another aspect, the present disclosure relates to a lighting device comprising: at least one first electrically activated solid state emitter arranged to generate first emissions comprising a dominant wavelength in a blue range; at least one first lumiphoric material arranged to receive at least a portion of the first emissions and produce first lumiphor emissions comprising a dominant wavelength in a green or yellow-green range; and at least one second lumiphoric material arranged to receive at least a portion of the first emissions and produce second lumiphor emissions comprising a dominant wavelength in a red range; wherein aggregate emissions of the lighting device include at least a portion of the first emissions, at least a portion of the first lumiphor emissions, and at least a portion of the second lumiphor emissions; wherein said aggregate emissions comprise a correlated color temperature (CCT) value; and wherein the lighting device comprises one of the following features (i) and (ii): (i) the at least one second lumiphoric material comprises a phosphor arranged to produce lumiphor emissions having at least one peak wavelength in a range of from 620 nm to 650 nm and full width-half maximum intensity value of less than 60 nm, and said aggregate emissions comprise a relative gamut area (Qg) value of at least the value obtained by the equation 127.35 minus the product of 0.0058 times the CCT value; and (ii) the at least one second lumiphoric material comprises a red quantum dot material arranged to produce lumiphor emissions having a peak wavelength in a range of from 620 nm to 650 nm, and said aggregate emissions comprise a relative gamut area value of at least 110.

In certain embodiments, a light bulb or light fixture may include at least one lighting device as disclosed herein.

In another aspect, the invention relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features, and embodiments of the invention will be more fully apparent from the ensuing disclosure and appended claims.

BRIEF DESCRIPTION OF THE DRAWINGS

FIG. 1 is a diagram orthogonally plotting CRI Ra versus Qg for certain BS(Y+R) warm white and BSY+R warm white LED lighting devices of Cree, Inc.

FIG. 2A is a table identifying various chromaticity, gamut area, color rendering, and luminous efficacy characteristics of six blue shifted yellow/green plus red ("BSY/G+R") LED lighting devices with different red emitter wavelengths in comparison to a BS(Y+R) LED lighting device ("EZW XTE").

FIG. 3 is a plot of R9 color rendering and R9-prime color rendering for lighting devices summarized in FIG. 2A and for two comparative devices, with trendlines for R9 and R9-prime showing the phenomenon of "foldback" in computation of R9-prime.

FIG. 4A includes photographs of two side-by-side identical mirror-image test booths including various colored objects.

FIG. 4B is a subjective vividness rating scale used by observers in the test booths depicted in FIG. 4A.

FIG. 4C is a plot of subjective vividness rating versus Qg, including subjective vividness ratings obtained from surveys of observers of the test booths of FIG. 4A.

FIG. 5A is a plot of Qg and R9-prime color rendering versus red (or red-orange) dominant wavelength for five BSY/G+R LED lighting devices according to FIGS. 2A and 2B, with overlaid rectangular regions corresponding to the subjective vividness rating scale values of 2 and 3 according to the rating scale of FIG. 4B.

FIG. 5B is a plot of subjective vividness rating versus red (or red-orange) dominant wavelength for the five BSY/G+R LED lighting devices of FIG. 5A, with overlaid rectangular regions corresponding to the subjective vividness rating scale values of 2 and 3 according to the rating scale of FIG. 4B.

FIGS. 6A to 6C are plots of chromaticities in CIE 1976 L*a*b* color space of multiple color patches used in the definition of Qg when illuminated with a sample source and when illuminated with a reference (blackbody) source, for BSY/G+R LED lighting devices including red dominant wavelengths of 605 nm, 610 nm, and 633 nm, respectively.

FIG. 7 is a diagram orthogonally plotting CRI Ra versus Qg for certain LED lighting devices of Cree, Inc. (Durham, N.C.) (including those shown in FIG. 1) in addition to devices of Soraa, Xicato, and Bridgelux, together with multiple high Qg BSY/G+R lighting devices and BSY+R LED lighting devices according to embodiments of the present disclosure.

FIG. 8 is a table summarizing CRI, Qg, and certain luminous efficacy values for various lighting devices identified in FIG. 7.

FIG. 9A is a plot of chromaticities in CIE 1976 L*a*b* color space of multiple color patches used in the definition of Qg when illuminated with a Cree CXA (95 CRI) BS(Y+R) LED lighting device and when illuminated with a reference (blackbody) source.

FIG. 9B is a table identifying chromaticity, gamut area, color rendering, and luminous efficacy characteristics of the device represented in FIG. 9A.

FIG. 10A is a plot of chromaticities in CIE 1976 L*a*b* color space of multiple color patches used in the definition of Qg when illuminated with a Xicao Vibrant (95 CRI)

BS(Y+R) LED lighting device versus and illuminated with a reference (blackbody) source.

FIG. 10B is a table identifying chromaticity, gamut area, color rendering, and luminous efficacy characteristics of the device represented in FIG. 10A.

FIG. 11 provides spectral diagrams including intensity versus wavelength for the lighting devices of FIGS. 9A-9B and FIGS. 10A-10B.

FIG. 12A is a table identifying various chromaticity, gamut area, color rendering, and luminous efficacy characteristics of two BSY/G+R lighting devices each having a LuAG/NYAG yellow-green phosphor mixture, in combination with red LEDs having different dominant wavelengths of 623 nm and 628 nm, respectively.

FIG. 12B is a table identifying various chromaticity, gamut area, color rendering, and luminous efficacy characteristics of two BSY+R lighting devices each having a NYAG yellow phosphor, in combination with red LEDs having different dominant wavelengths of 623 nm and 628 nm, respectively.

FIG. 12C provides spectral diagrams including intensity versus wavelength for the lighting devices of FIGS. 12A and 12B.

FIG. 13 is a table identifying various chromaticity, gamut area, color rendering, and luminous efficacy characteristics of five different lighting devices each including red LEDs with relatively long red peak wavelengths.

FIG. 14A is a table identifying various chromaticity, gamut area, color rendering, and luminous efficacy characteristics of a BSG+R LED lighting device including a narrow wavelength green lumiphor.

FIG. 14B is a plot of chromaticities in CIE 1976 L*a*b* color space of multiple color patches used in the definition of Qg when illuminated with the BSG+R LED lighting device of FIG. 14A and when illuminated with a reference (blackbody) source.

FIG. 14C provides a spectral diagram including intensity versus wavelength for the lighting device of FIGS. 14A and 14B.

FIG. 15A includes a bar chart and numerical moments of spectral full width-half maximum for a BOSE green (BG201B) phosphor.

FIG. 15B includes a bar chart and numerical moments of spectral full width-half maximum for a GAL535 (LuAG type) green phosphor.

FIG. 15C is a line chart representing peak wavelengths for the phosphors of FIGS. 15A and 15B and for a GAL535:NYAG4 1:1 green:yellow phosphor mixture.

Figure 16:
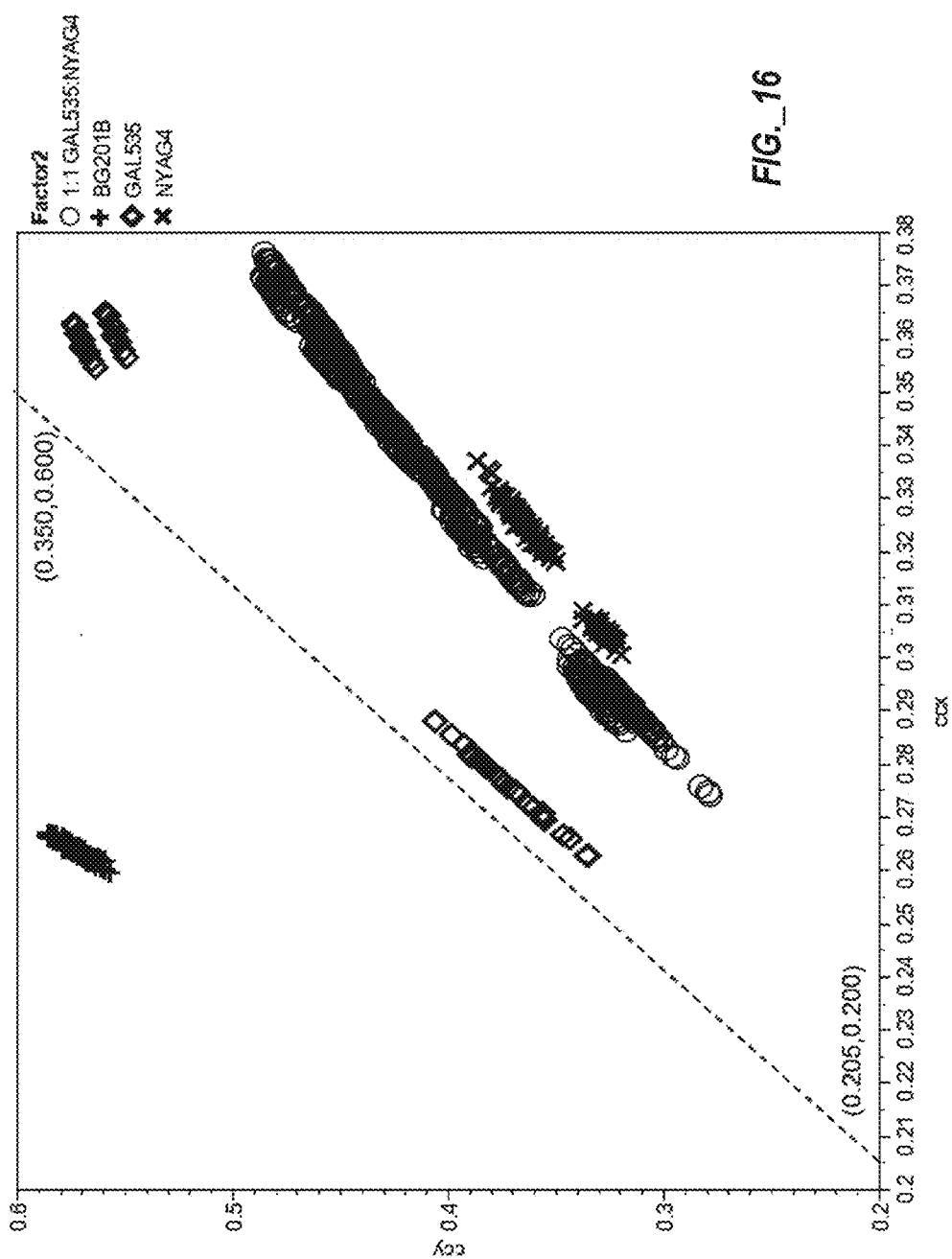

FIG. 16 is a plot of color points for sources including blue LEDs of various wavelengths, BSY sources with 100% NYAG4 yellow phosphor, BSG sources with 100% GAL535 green phosphor, a BSG sources with 100% BG201B green phosphor, and GAL535:NYAG4 1:1 green:yellow phosphor mix sources, with addition of a dashed line offset above the data points for the sources with 100% GAL535 green phosphor.

FIG. 17 is a CIE 1931 (x,y) chromaticity diagram illustrating the blackbody locus ("BBL," also known as the Planckian locus) and a first dash-line closed shape with vertices A, C, D, and F that includes BSG subcombination color points produced by a blue solid state light emitter in combination with at least one lumiphoric material as utilized in BSG+R devices according to at least some embodiments of the present disclosure.

FIGS. 18A-18C are side cross-sectional views illustrating examples of packaged solid state emitters that may be used in lighting devices according to at least some embodiments of the present disclosure.

FIG. 19A is a side cross-sectional schematic view of a packaged solid state emitter (e.g., LED) and at least one lumiphor dispersed in an encapsulant material disposed over the solid state emitter, which may be used in lighting devices according to at least some embodiments of the present disclosure.

FIG. 19B is a side cross-sectional schematic view of at least one packaged solid state emitter (e.g., LED) and at least one lumiphor arranged in one or more layers spatially separated from the solid state emitter(s), which may be used in lighting devices according to at least some embodiments of the present disclosure.

FIG. 19C is a side cross-sectional schematic view of a package including multiple solid state emitters (e.g., LEDs) and at least one lumiphor dispersed in an encapsulant material disposed over the multiple solid state light emitters, which may be used in lighting devices according to at least some embodiments of the present disclosure.

FIG. 19D is a side cross-sectional schematic view of a package including multiple solid state emitters (e.g., LEDs) and at least one lumiphor arranged in one or more layers spatially separated from the multiple solid state light emitters, which may be used in lighting devices according to at least some embodiments of the present disclosure.

FIG. 19E is a side cross-sectional schematic view of a package including multiple solid state emitters (e.g., LEDs), with at least one solid state emitter having at least one lumiphor individually applied or coated over at least one surface of the solid state emitter.

FIG. 20 is a side cross-sectional view of a first light bulb arranged to incorporate multiple solid state emitters according to at least some embodiments of the present disclosure.

FIG. 21 is a side cross-sectional view of a second, reflector-type light bulb arranged to incorporate multiple solid state emitters according to at least some embodiments of the present disclosure.

FIG. 22A is an upper perspective view of a troffer-type light fixture arranged to incorporate multiple solid state emitters according to at least some embodiments of the present disclosure.

FIG. 22B is a side cross-sectional view of the troffer-type light fixture of FIG. 22A.

Figure 23:
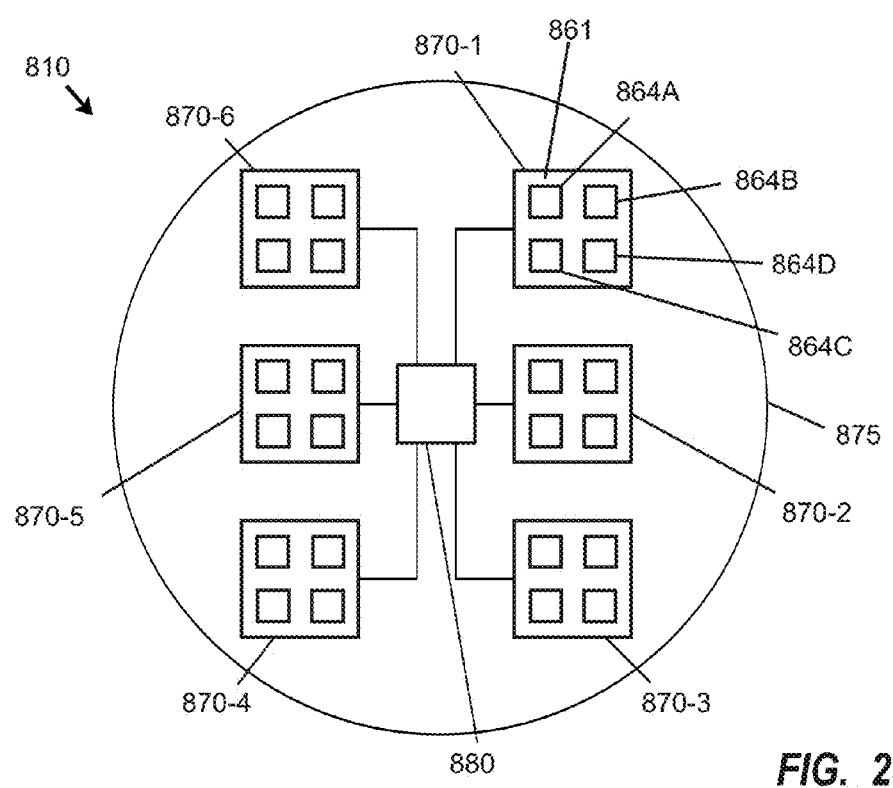

FIG. 23 is a simplified plan view of a light emitting apparatus including multiple solid state emitters and at least one control circuit according to at least some embodiments of the present disclosure.

FIG. 24A is a top perspective view of a solid state emitter package including four solid state emitter chips arranged over a substrate, covered with a hemispherical lens, and connected to electrical traces via wirebonds.

FIG. 24B is a bottom plan view of the solid state emitter package of FIG. 24A including four anodes and four cathodes arranged along opposing sides of a substrate, and including a thermally conductive contact pad arranged between the anodes and cathodes.

Figure 25A:
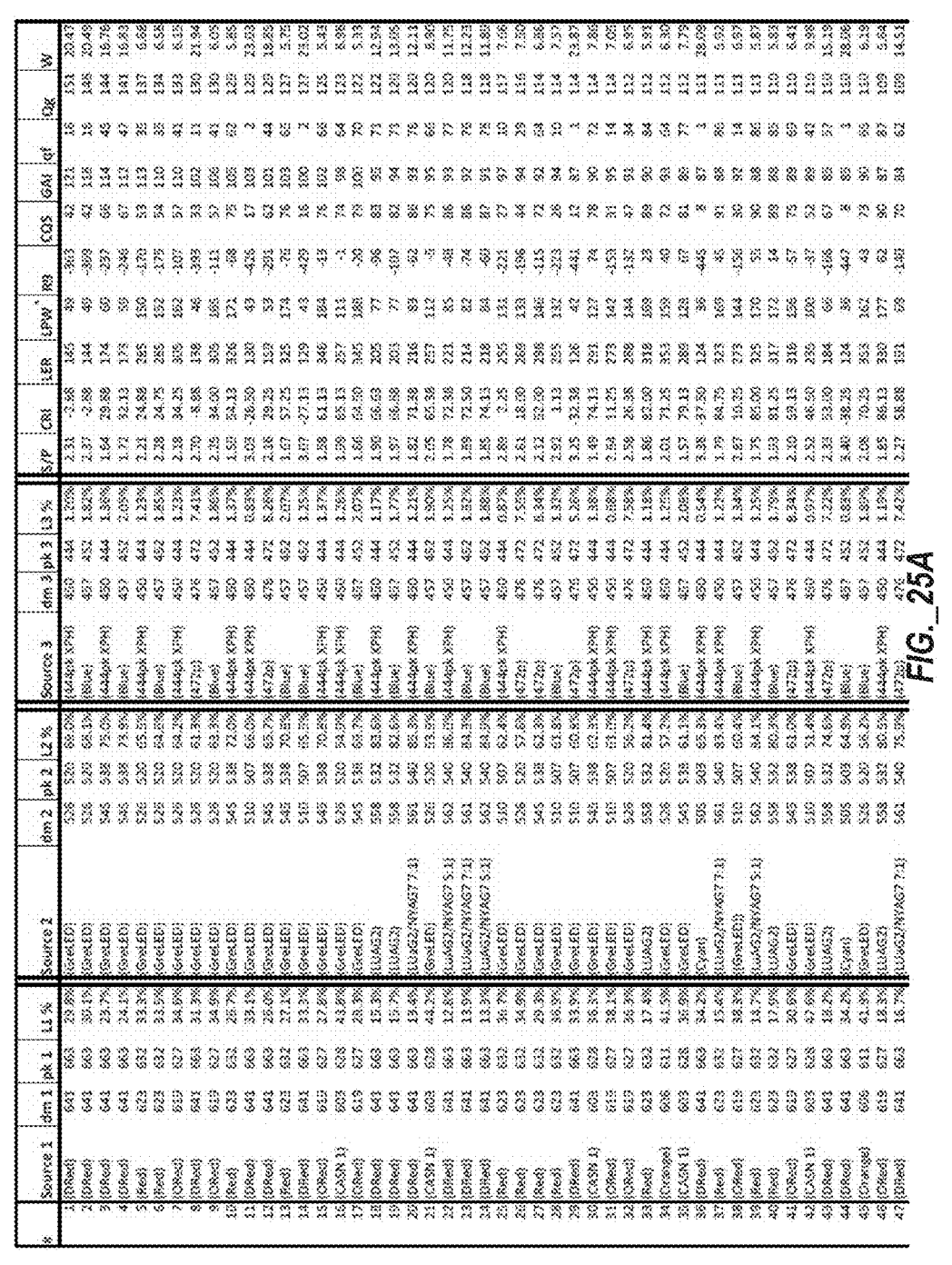
Figure 25B:
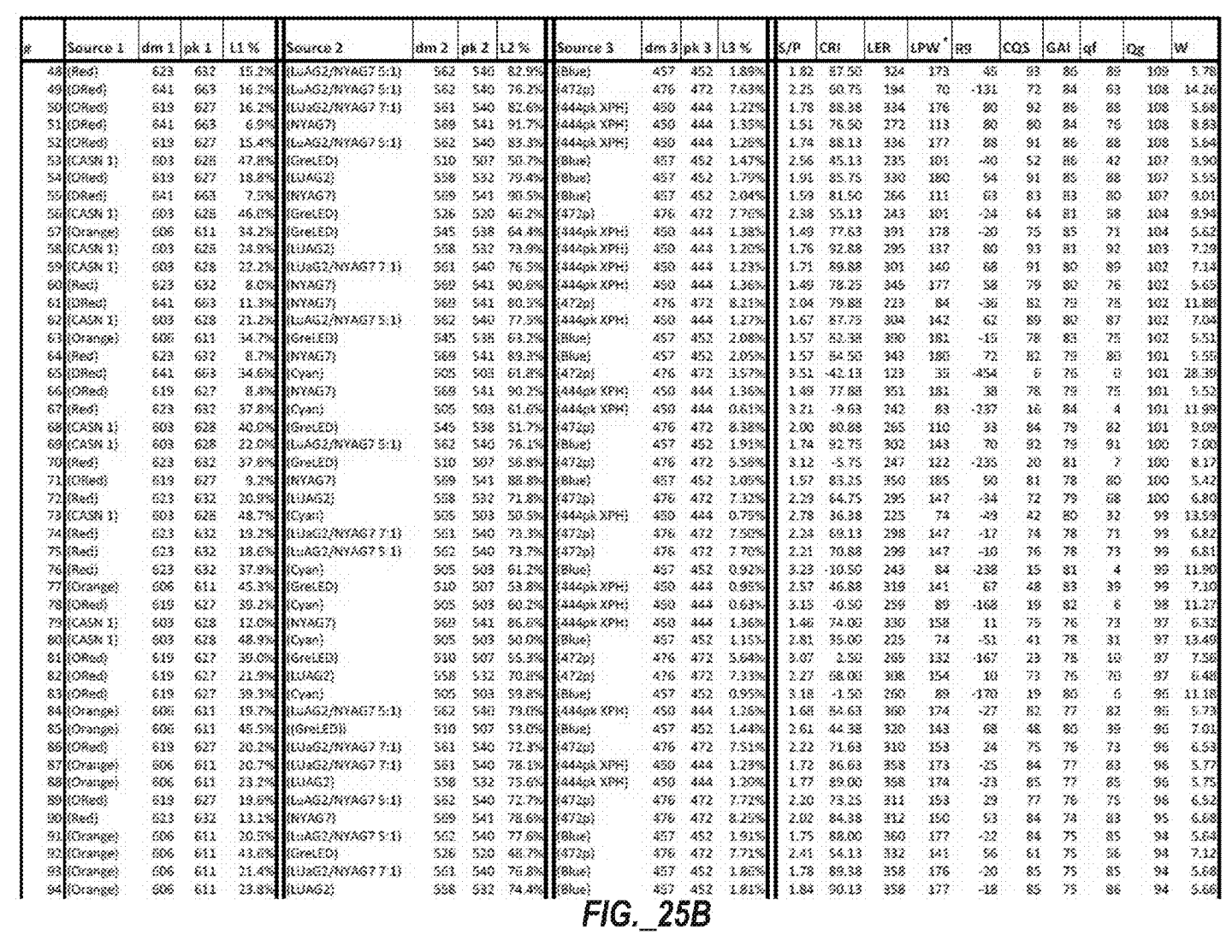
Figure 25C:
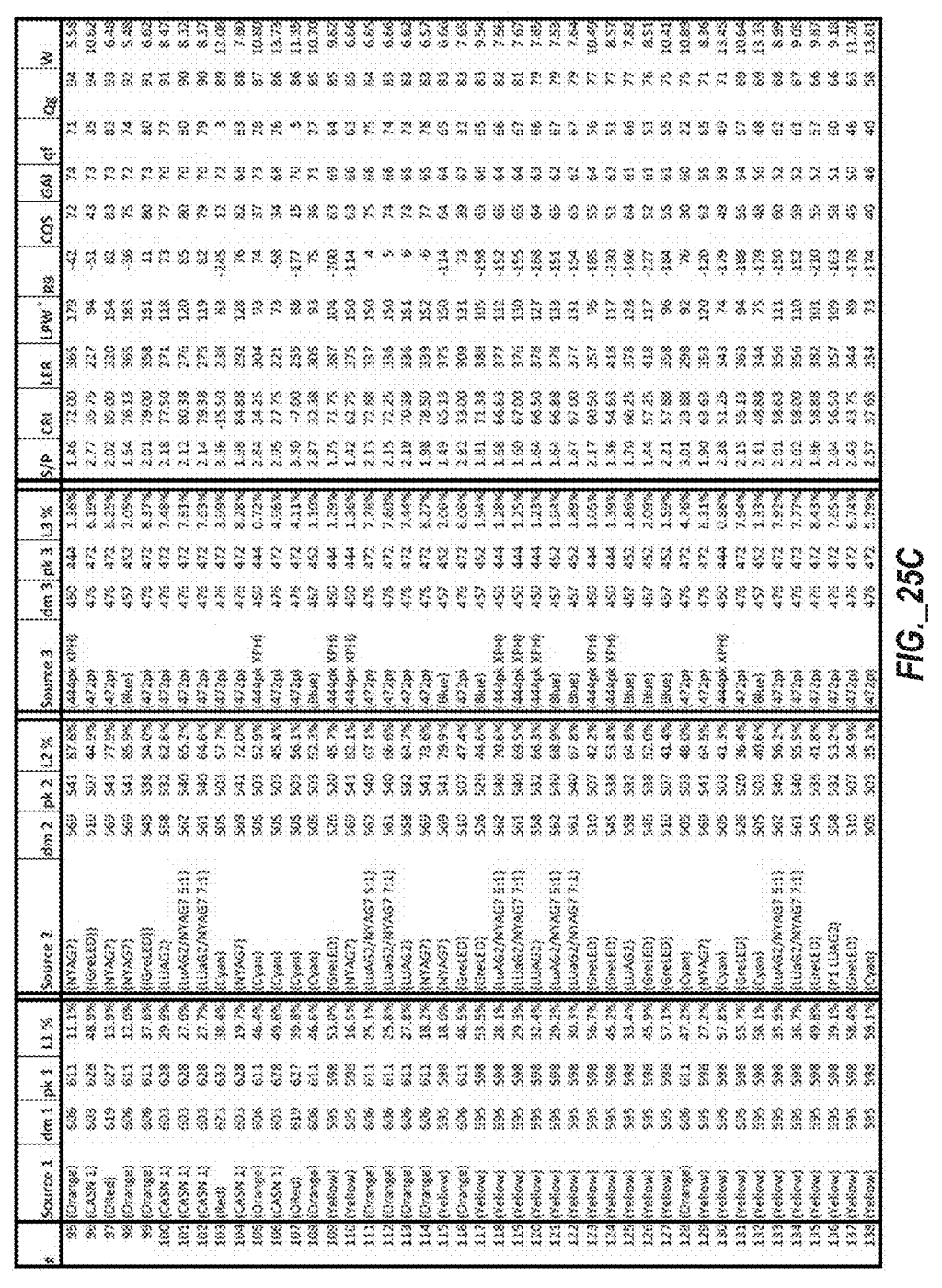

FIGS. 25A-25C embody a table identifying gamut area, color rendering, and luminous efficacy characteristics of modeled solid state lighting devices at CCT values of 4000K including various combinations of solid state emitters and/or phosphors, sorted from high to low Qg values.

Figure 26A:
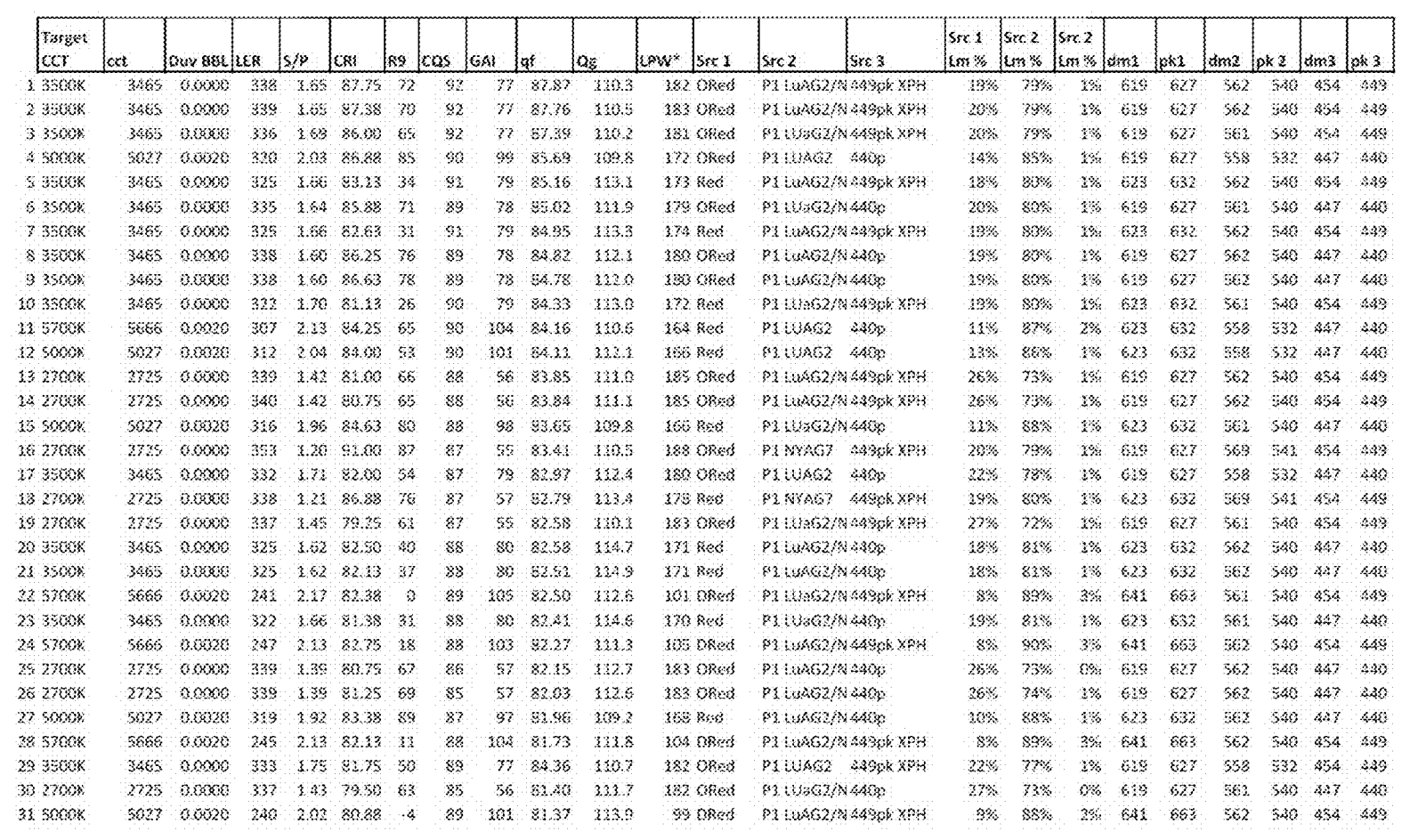
Figure 26B:
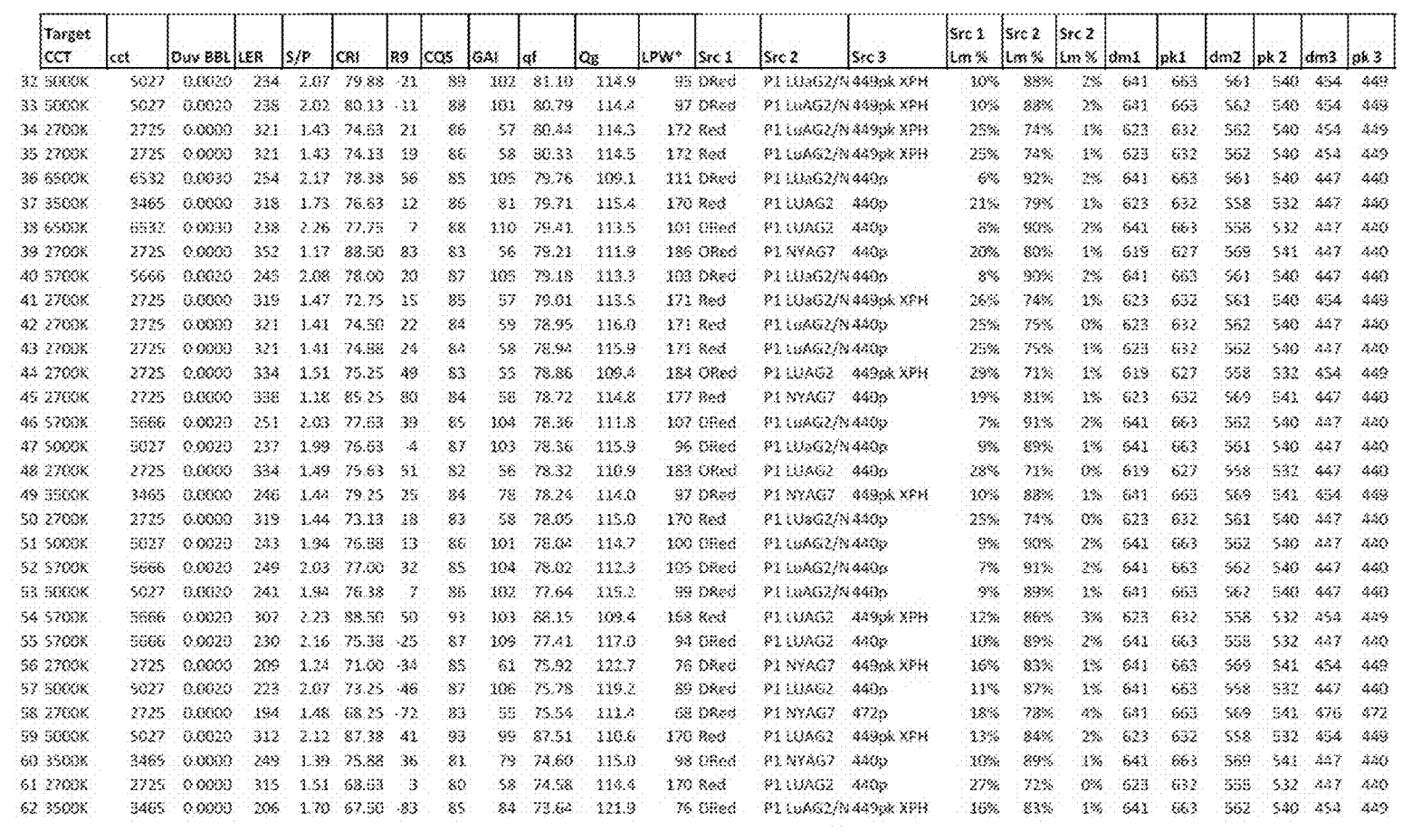
Figure 26C:
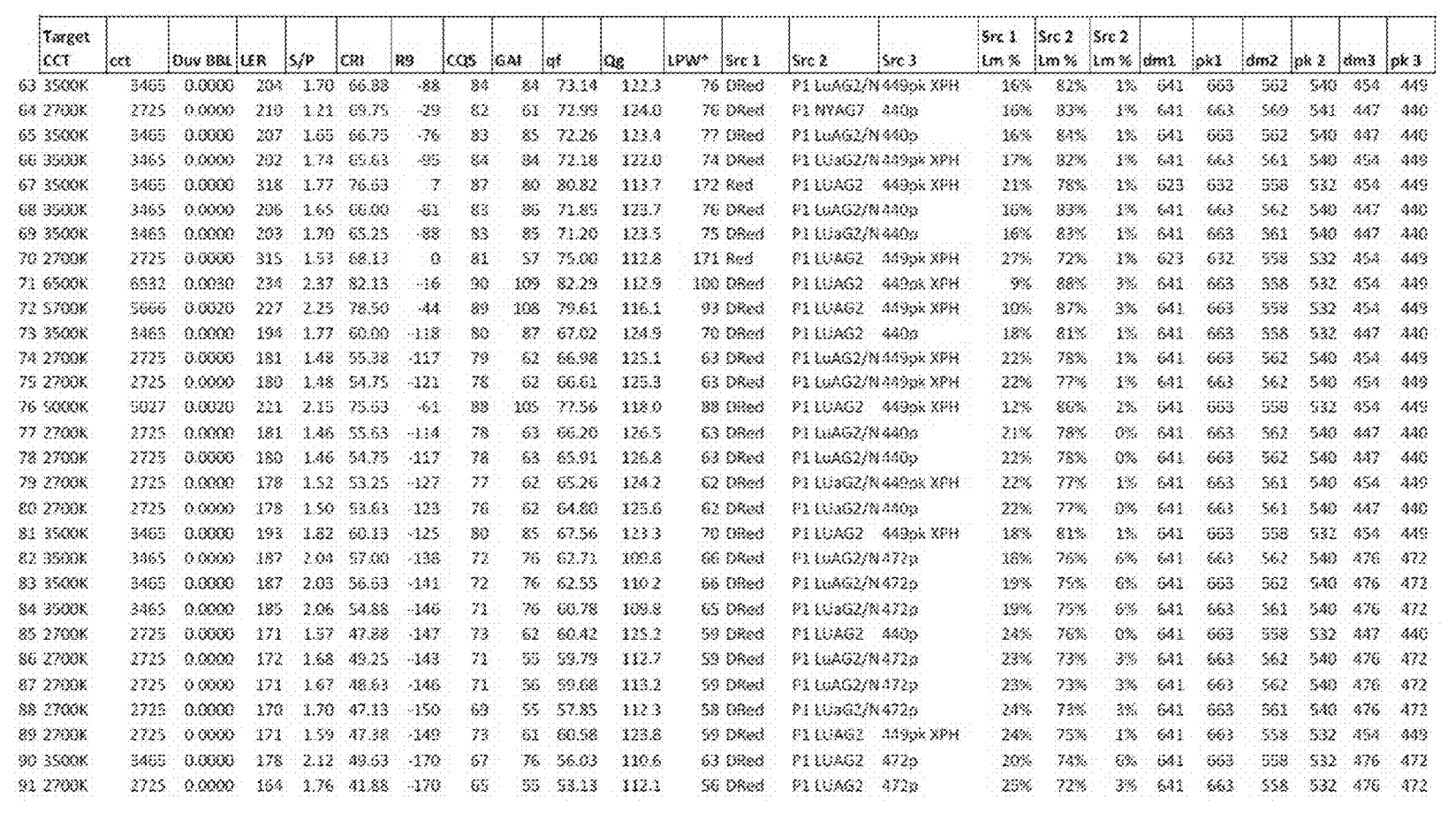

FIGS. 26A-26C embody a table identifying gamut area, color rendering, and luminous efficacy characteristics of modeled BSY+R, BSG+R, and BSY/G+R solid state lighting devices at various CCT values from 2700K to 6500K.

FIG. 27 provides a spectral diagram including intensity versus wavelength obtained by simulation of a lighting device including a blue LED having a 450 nm dominant wavelength arranged to stimulate emissions of (i) a 2:1 green:yellow mixture of GAL535/NYAG phosphors and (ii) at least one red quantum dot material.

FIG. 28 is a table identifying Qg and CRI for a simulated lighting device according to FIG. 27 as a function of red quantum dot material peak wavelength at CCT values of 3000K and 4000K, respectively.

FIG. 29A is a table identifying Qg and CRI values as a function of CCT (for seven CCT values spanning from 2500K to 5000K) for a simulated lighting device including a blue LED (450 nm dominant wavelength) arranged to stimulate emissions of both a NYAG phosphor and a red phosphor having a relatively narrow spectral output.

FIG. 29B is a scatter plot of Qg as a function of CCT for the simulated lighting device of FIG. 29A, with a superimposed best fit line for the plotted points.

FIG. 30 is a table identifying Qg and CRI values as a function of CCT (for three CCT values spanning from 2700K to 3500K) for a simulated lighting device including a blue LED (452 nm dominant wavelength) arranged to stimulate emissions of both a GAL phosphor and a red phosphor having a relatively narrow spectral output.

DETAILED DESCRIPTION

As noted previously, the art continues to seek solid state lighting devices providing desirable illumination characteristics. Color quality has traditionally been defined with respect to CRI, which considers fidelity relative to daylight or an equal energy source. But it has been confirmed by the Applicants that higher vibrancy associated with more saturated colors may be preferred by a majority of consumers, at least in certain environments such as retail stores, restaurants, grocery stores, auto dealers, etc. Strong separation of reds, greens, and blues in a light source tend to support high Qg, but not always in combination with high efficacy. Moreover, higher vibrancy associated with particularly saturated red—even considered oversaturated according to traditional measures such as CRI Ra and R9 coloring index—may be particularly preferred in certain environments.

Various embodiments disclosed herein relate to lighting devices capable of providing light with enhanced vividness (e.g., high Qg), in combination with at least moderately high luminous efficacy (e.g., lumens per watt), with further capability to promote high to very high saturation of red color. Very high saturation of red color may be quantified by a high "R9-prime" color rendering value (e.g., R9-prime exceeding 100 or another threshold specified herein), with R9-prime representing a modified R9 color rendering regime in which values above 100 may be obtained. Enhanced vividness (e.g., Qg and/or Qg in combination with R9-prime) may be obtained, for example, with at least one of (i) a red emitter peak wavelength of at least 630 nm, (ii) a green lumiphoric material having a narrow peak wavelength, and (iii) a blue-shifted green color point within a specified region of a 1931 CIE chromaticity diagram.

Preferred lighting devices include an electrically activated solid state emitter arranged to output light having a dominant wavelength in the blue range, at least one lumiphoric material arranged to output light having a dominant wavelength in the green or yellow-green range, and another electrically activated solid state emitter arranged to output light having a dominant wavelength in the red or red-orange range. The term "dominant wavelength" as used herein refers to the dominant wavelength at a reference condition used to classify LED die or individual lamps, and in general it is different from the dominant wavelength that would be measured under luminaire operating conditions of any particular embodiment. In certain embodiments, increased saturation can be achieved with a red emitter peak wavelength of at least 630 nm, preferably in combination with a sufficient green content to provide elevated Qg values, preferably in combination with elevated R9-prime color rendering values. In certain embodiments, increased saturation can be achieved with a relatively narrow spectrum yellow or green lumiphor (e.g., having a peak wavelength in a range of from 510 nm to 570 nm for yellow or green (or from 510 nm to 544 nm for green) and having a full width-half maximum (FWHM) intensity value of less than 90 nm, of less than 80 nm, of less than 75 nm, or another range specified herein), preferably in combination with sufficient red spectrum emissions to provide elevated Qg values, preferably in combination with elevated R9-prime color rendering values. In certain embodiments, a BSG portion of aggregate BSG+R emissions includes a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.257, 0.345), a second line having x, y endpoint coordinates of (0.257, 0.345) and (0.332, 0.551), a third line having x, y endpoint coordinates of (0.332, 0.551) and (0.020, 0.770), and a curve corresponding to a portion of the spectrum locus having x, y endpoint coordinates of (0.020, 0.770) and (0.040, 0.329). Such BSG portion is preferably combined with sufficient red spectrum emissions to provide aggregated BSY+R emissions and elevated Qg values, preferably in combination with elevated R9-prime color rendering values. In certain embodiments, a mixture of multiple lumiphoric materials may be provided, such as a mixture of green and yellow lumiphoric materials.

FIG. 1 is an orthogonal plot of CRI and Qg for certain BS(Y+R) warm white and BSY+R warm white LED lighting devices of Cree, Inc. (Durham, N.C., USA) all having nominal CCT values of 3000K. The solid square data points (Cree "EasyWhite" or "EZW" XTE, ZPE, and CXA) correspond to BS(Y+R) devices in which one or more blue LEDs pump yellow and red phosphors. The maximum value obtained for these BS(Y+R) devices is around 99. The open square data point (Cree BSY+RDO: LMH2 3000K) corresponds to a BSY+RDO (BSY plus red-orange LED) device with a relatively short red peak wavelength (e.g., less than 620 nm or less), with a CRI value of nearly 94 and a Qg value of about 105. It should be noted that Qg is affected by CCT. Sources with CCT values less than 3000K naturally tend to have higher Qg values due to presence of significant red content. As CCT values increase, reduced relative red content tends to cause Qg values to decline.

More specific aspects of the invention will be described after terms are defined and general concepts are introduced.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

Embodiments of the invention are described herein with reference to cross-sectional, perspective, elevation, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. The invention may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the invention have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on," "above," "upper," "top," "lower," or "bottom" may be used herein to describe a relationship between one structure or portion to another structure or portion as illustrated in the figures, but it should be understood that such relative terms are intended to encompass different orientations of the device in addition to the orientation depicted in the figures.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. Solid state light emitting devices according to embodiments disclosed herein may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelengths, or of at least one desired perceived color (including combinations of colors that may be perceived as white). Lumiphoric materials may be provided in the form of particles, films, or sheets. Quantum dot materials of various colors are commercially available from QD Vision, Inc. (Lexington, Mass., USA), Nanosys Inc. (Milpitas, Calif., USA), and Nanoco Technologies Ltd. (Manchester, United Kingdom), among others.

Inclusion of lumiphoric (also called "luminescent") materials in lighting devices as described herein may be accomplished by any suitable means, including: direct coating on solid state emitters; dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. No. 6,600,175 and in U.S. Patent Application Publication Nos. 2009/0184616 and 2012/0306355, and methods for coating light emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

Examples of phosphors that may be used according to various embodiments include, without limitation, cerium (III)-doped yttrium aluminum garnet (Ce:YAG or YAG:Ce); yttrium aluminum oxide doped with cerium yttrium aluminum garnet (NYAG); lutetium aluminum garnet (LuAG), green aluminate (GAL, including but not limited to GAL535); $(Sr,Ba,Ca)_2$-$xSiO_4$:$Eu_x$ (BOSE, including both BOSE yellow and BOSE green varieties, including for example $(Ba,Sr)_2SiO_4$:$Eu^{2+}$); and CASN ($CaAlSiN_3$:$Eu^{2+}$). In certain embodiments, two or more phosphors may be mixed or provided in one or more discrete regions of a single lighting device.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiments, at least one lumiphoric material may be applied to a solid state emitter or a lumiphoric material support surface by patterning, which may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses, multiple optical elements, and multiple reflectors. Examples of optical elements include, but are not limited to, elements arranged to affect light mixing, focusing, collimation, dispersion, and/or beam shaping.

In certain embodiments, a solid state lighting device (e.g., package) may include a reflector cup defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s)), with an encapsulant material arranged over the emitter(s) and in contact with the at least one boundary wall.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage (e.g., road signs), a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting (work lights, etc.), mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element. In certain embodiments, a solid state lighting device lacks any "unconverted" blue-emitting solid state emitter not arranged to stimulate emissions of a lumiphoric material.

Subject matter herein relates in certain embodiments to a method of illuminating an object, space, or enclosure using at least one lighting device or lighting apparatus as disclosed herein, optionally by energizing a single power line connected to multiple lighting devices and/or by pulse width modulation control of the at least one lighting device or lighting apparatus.

Subject matter herein relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). Subject matter herein further relates to an illuminated area comprising at least one item selected from among the group consisting of a structure, a swimming pool or spa, a room, a warehouse, an indicator, a road, a parking lot, a vehicle, signage (e.g., road signs), a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

In certain embodiments, lighting devices as disclosed herein may provide emissions exhibiting enhanced vividness in combination with relatively high CRI Ra (e.g., according to one or more threshold ranges for Qg and CRI Ra recited herein) without use of any notch filtering material arranged to affect reflection or to at least partially inhibit transmission of light. A notch filtering material when arranged on or in a light transmissive surface of a lighting device will inherently entail at least some attenuation of light and concomitant reduction of luminous efficacy. Presence of notch filtering material in a lighting device may also increase need for heat dissipating structures (e.g., heatsinks) since notch filtering material is subjected to being heated by absorbed light energy. As a result, providing a lighting device that is devoid of notch filtering material may avoid reduction of luminous efficacy, and may reduce need for heat dissipating structures, relative to a lighting device incorporating a notch filtering material.

In other embodiments, lighting devices as disclosed herein may include or have associated therewith one or more notch filtering materials, such as to enhance GAI (or Qg) and/or CRI Ra. The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. If provided, a notch filtering material may be added to a light-transmissive element, a light scattering element, and/or a light reflecting element.

Since a notch filtering material may affect Qg, in certain embodiments Qg values may be specified for aggregate emissions (including a portion of blue solid state emitter emissions, at least a portion of yellow and/or green lumiphor emissions, and at least a portion of red solid state emitter emissions) prior to passage through any optionally present notch filtering element arranged to at least partially inhibit transmission of said aggregate emissions. Such language does not compel the presence or absence of a notch filtering material, but simply refers to a situation in which Qg should be computed prior to transmission through any notch filtering material. If a lighting device is devoid of notch filtering material, then such aggregate emissions correspond to emissions exiting the lighting device. If a lighting device includes a notch filtering material, then such aggregate emissions may correspond to an intermediate region of a lighting device "upstream" of any notch filtering element.

Figure 2B:
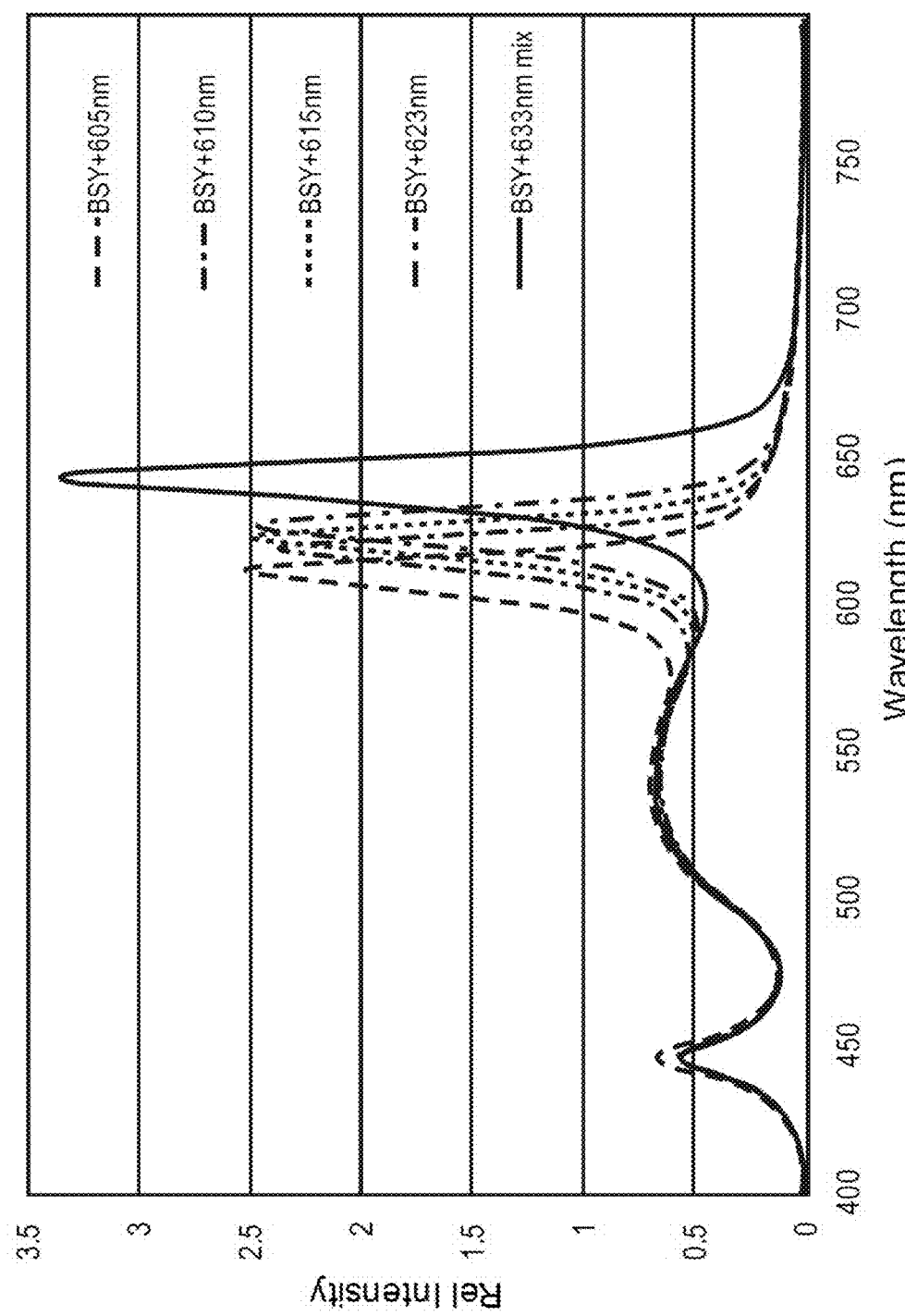
FIG. 2B provides spectral diagrams including intensity versus wavelength for five of the six BSY/G+R LED lighting devices summarized in FIG. 2A.

To consider the effect of red solid state emitter wavelength on Qg, various BSY+R devices were constructed, each having a 450 nm dominant wavelength blue LED arranged to stimulate a 2:1 green:yellow mixture of LuAG/NYAG phosphors with addition of a LED of different dominant wavelengths (namely, 605 nm, 610 nm, 615, nm, 623 nm, 628 nm, and 633 nm). Such devices were compared to a baseline 90 CRI Cree EZW XTE device embodying blue LEDs arranged to pump a mixture of yellow and red phosphors. FIG. 2A provides various chromaticity, gamut area, color rendering, and luminous efficacy characteristics of the six different types of BSY/G+R LED lighting devices in comparison to the baseline BS(Y+R) LED lighting device. Each device had a CCT near 3050K, and had a color point near the BBL (e.g., Duv of no greater than +/−0.00051). The baseline BS(Y+R) device exhibited a blue peak wavelength of 455 nm and a red peak wavelength of 618 nm. Each BSY/G+R device exhibited a blue peak wavelength of 446 nm or 447 nm, and red peak wavelengths of 612 nm, 619 nm, 623 nm, 627 nm, 642 nm, and 643 nm (corresponding to dominant red wavelengths of 605 nm, 610 nm, 615, nm, 623 nm, a mix of 628 nm/633 nm, and 633 nm, respectively). Observable trends from FIG. 2A include: Qg increases with increasing red peak wavelength; CRI Ra is maximized near a red peak wavelength of 619 and declines significantly for longer red peak wavelengths; R9 color rendering is maximized near a red peak wavelength of 623 nm, and then declines significantly for longer red peak wavelengths; and the "R9-prime" value increases with increasing peak wavelength. Each BSY/G+R device exhibited a greater Qg than the baseline BS(Y+R) device. Spectral diagrams including intensity versus wavelength for five of the six BSY/G+R LED lighting devices are provided in FIG. 2B.

The concept of "R9-prime" is illustrated in FIG. 3. As noted previously, R9 is one of six saturated test colors not used in calculating CRI, with R9 embodying a large red content. CRI Ra is concerned with matching the color rendering of a natural light source at the same CCT, and as such, penalizes light sources that produce under-saturation as well as over-saturation. R9 behaves in the same manner, in that R9 values increase with increasing saturation (to a maximum value of 100), and then R9 values start to decline when oversaturation conditions are attained. Unfortunately, the same R9 value may be assigned to an undersaturated or oversaturated condition. The concept of R9-prime seeks to remedy deficiencies associated with R9. In a "standard" (less vivid) region, R9-prime equals R9. As saturation conditions increase, however, R9-prime values are intended to increase smoothly into the high-vividness (e.g., oversaturated) region. FIG. 3 is a plot of R9 color rendering and R9-prime color rendering for lighting devices summarized in FIG. 2A and for two comparative devices, with trendlines for R9 and R9-prime showing the phenomenon of "foldback" in computation of R9-prime. Solid points embody R9 values, and hollow diamonds embody R9-prime values. As saturation (and Qg) increases beyond a maximum R9 value of 100, R9 values decline while R9-prime values increase. The forked dashed line in FIG. 3 illustrates this phenomenon. The dashed line in the lower left quadrant corresponds to both R9 and R9-prime. Such lines diverge thereafter with increasing saturation, with the upwardly sloping dashed line in the upper right quadrant corresponding to R9-prime, and with the downwardly sloping dashed line in the lower right quadrant corresponding to R9. As shown in FIG. 3, the Cree CXA (90 CRI) BS(Y+R) device exhibits a R9 value of less than 100 and a Qg value of about 96, and a third party "Soraa Vivid" lighting device believed to include a BS(Y+R) component exhibits a R9 value between 90 and 100, and exhibits a Qg value of about 98. A number of BSY/R+G devices indicated by the hollow diamonds in the upper right quadrant of FIG. 3 exhibit R9-prime values in a range of from 125 to 220 or more, and exhibit Qg values between 110 and 120.

To address a question of whether lighting devices providing high Qg (as well as elevated R9-prime) values, potentially in combination with reduced CRI Ra, may be acceptable to consumers, surveys were administered to 8 people who observed two side-by-side object-containing mirror image test booths that were subject to being illuminated differently. Such test booths are shown in FIG. 4A. One booth (on the right side) was illuminated with a reference source embodying a Cree XTE EZW 90 CRI BS(Y+R) LED lighting device having a Qg value of 96, and the other booth (on the left side) was illuminated with a test illuminant including a high Qg source as summarized in FIGS. 2A-2B. Observers were positioned about 2 feet from the lighting booths, and a time period of 15 to 30 seconds was provided for observers to acclimate to the light level. Observers were requested to concentrate on colored items and not on the white background. Observers were asked to rate vividness for the high Qg source in comparison to the reference source. In particular, observers were asked (i) whether there is a booth where color is more vivid than the other; (2) if so, to rate the overall color vividness according to the scale shown in FIG. 4B; (3) whether there is a booth where red color is more vivid than the other, and (4) if so, to rate the red color vividness using the scale of FIG. 4B. The rating scale included values of "0" corresponding to "no difference," "1" corresponding to "small difference but noticeable," "2" corresponding to "interesting" and "noticeable," "3" corresponding to "nice" and "wow," and "4" corresponding to "too much!" A first set of results is shown in FIG. 4C, which is a plot of subjective vividness rating versus Qg. Qg values in a range of from about 110 to about 115 were considered "interesting" (and "noticeable") whereas a Qg value of 120 corresponded to survey results of "nice" and "wow."

FIG. 5A is a plot of Qg and R9-prime color rendering versus red (or red-orange) dominant wavelength for five BSY/G+R LED lighting devices according to FIGS. 2A and 2B (and as used in the above-described survey), with overlaid rectangular regions corresponding to the subjective vividness rating scale values of 2 and 3 according to the rating scale of FIG. 4B. As shown in FIG. 5A, R9-prime values and Qg values embody similar trend shapes, with illumination sources exhibiting elevated R9-prime values (e.g., to a value of about 220) and elevated Qg values (e.g., to a value of about 119) tending to exhibit recognition by observers of increased vividness. The dominant red wavelengths of 605 nm, 610 nm, 615, nm, 623 nm, and 633 nm correspond to red peak wavelengths of 612 nm, 619 nm, 623 nm, 627 nm, and 643 nm, respectively).

FIG. 5B is a plot of subjective vividness rating versus red-orange dominant wavelength for the five BSY/G+R LED lighting devices of FIG. 5A, with overlaid rectangular regions corresponding to the subjective vividness rating scale values of 2 and 3 according to the rating scale of FIG. 4B. As shown in FIG. 5B, observer impressions of increased vividness of all colors, and of red in particular, increase with increasing red dominant wavelength.

FIGS. 6A to 6C are plots of chromaticities in CIE 1976 L*a*b* color space of multiple color patches used in the definition of Qg when illuminated with a sample source and when illuminated with a reference (blackbody) source, for BSY/G+R LED lighting devices including red dominant wavelengths of 605 nm, 610 nm, and 633 nm, respectively. FIG. 6A corresponds to a BSY/G+R LED lighting having a peak wavelength of about 612 nm; FIG. 6B corresponds to a BSY/G+R LED lighting having a peak wavelength of about 619 nm; and FIG. 6C corresponds to a BSY/G+R LED lighting having a peak wavelength of about 643 nm. In each of FIGS. 6A-6C, the upper left corner is predominantly green, the upper right corner is predominantly red, the lower right corner is predominantly purple or pink, and the lower left corner is predominantly blue. A review of FIGS. 6A-6B indicates that the test illuminant exhibits increased gamut with increasing red dominant wavelength—with particularly pronounced differences in the upper right (red) and upper left (green) quadrants.

FIG. 7 is a diagram orthogonally plotting CRI Ra versus Qg for certain LED lighting devices of Cree, Inc. (Durham, N.C.) (including those shown in FIG. 1) in addition to devices of Soraa, Xicato, and Bridgelux, together with multiple high Qg BSY/G+R lighting devices and BSY+R LED lighting devices according to embodiments of the present disclosure. It is noted that FIG. 7 includes an extended y-axis (CRI) relative to FIG. 1, with a lower boundary of 70 instead of 80. The six high Qg BSY/G+R lighting devices correspond to those described in connection with FIG. 2A having red-orange or red dominant wavelengths of 605 nm, 610 nm, 615, nm, 623 nm, a 623 nm/633 nm mix, and 633 nm (corresponding to peak wavelengths of 612 nm, 619 nm, 623 nm, 627 nm, 642 nm, and 643 nm, respectively). The five BSY+R lighting devices each included a 450 nm dominant wavelength blue LED arranged to stimulate a NYAG phosphor in combination with a different red LED having dominant wavelengths of 610 nm, 615, nm, 623 nm, 628 nm, and 633 nm (corresponding to peak wavelengths of 619 nm, 623 nm, 627 nm, 636 nm, and 643 nm, respectively). As shown in FIG. 7, Qg increases with increasing red dominant wavelength for the BSY/G+R and BSY+R devices, but the BSY/G+R devices each exhibit higher Qg than the corresponding BSY+R device with the same red LED dominant wavelength. However, the BSY/G+R devices exhibit a sharper and more dramatic decline of CRI Ra with increasing red LED dominant wavelength relative to the BSY+R devices.

FIG. 8 is a table summarizing CRI, Qg, and certain luminous efficacy values for various lighting devices identified in FIG. 7. The Soraa, Xicato, and Bridgelux devices (embodying BS(Y+R) devices) all exhibit significantly lower luminous efficacy (lumens per watt or LPW) than the remaining devices that each include at least one red LED instead of a blue-pumped red phosphor. The BSY/G+R devices exhibit reduced (e.g., 12% to 22% reduced) LPW relative to a point-of-reference Cree BSY+R 3000K source, but still exhibit greater luminous efficacy than the BS(Y+R) devices of Soraa, Xicato, and Bridgelux. Although not shown in FIG. 7, Applicants are aware of a LEDnovation Enhancelite light bulb (LEDnovation, Inc., Tampa, Fla., US) including at least one blue LED (444 nm) arranged to stimulate emissions of a phosphor (believed to be a green: yellow phosphor mixture having a green:yellow phosphor ratio of substantially less than 1:1), and at least one red LED (peak wavelength of 628 nm), with the bulb exhibiting a CRI Ra of 90.7, Qg of 111, CCT of 2822, and duv of −0.0013 according to measurements performed by Applicants. Test results for a LEDnovation Enhancelite A19 LED light bulb (model no. LED-A19-60-1-27D-IO) published by LED Light Review (http://led-light-review.com/reviews/lednovation-enhancelite-a19/) note that the A19 bulb has a luminous efficacy of 86 LPW and a CRI Ra of 94. Relative to the LEDnovation Enhancelite bulb tested by Applicants, the BSY/G+R including a 628 nm/633 nm red dominant wavelength LED mix (642 nm peak) LED device and the BSY/G+R including a 633 nm dominant (643 nm peak) red LED device include longer peak wavelength red LEDs and exhibit higher Qg values of 115 and 119, respectively.

FIG. 9A is a plot of chromaticities in CIE 1976 L*a*b* color space of multiple color patches used in the definition of Qg when illuminated with a Cree CXA (95 CRI) BS(Y+R) LED lighting device and when illuminated with a reference (blackbody) source. FIG. 9B is a table identifying chromaticity, gamut area, color rendering, and luminous efficacy characteristics of the device of FIG. 9A. FIG. 10A is a plot of chromaticities in CIE 1976 L*a*b* color space of multiple color patches used in the definition of Qg when illuminated with a Xicato Vibrant (95 CRI) BS(Y+R) LED lighting device versus and illuminated with a reference (blackbody) source. FIG. 10B is a table identifying chromaticity, gamut area, color rendering, and luminous efficacy characteristics of the device represented in FIG. 10A. Both devices exhibit CRI Ra of at least 95 and similar CCT values (3021K versus 2928K), but the Xicato Vibrant device exhibits a greater Qg value of 107 versus 96.4 and a greater R9 color rendering value of 89.5 versus 79.7.

FIGS. 12A and 12B provide a basis for comparing BSY/G+R and BSY+R devices including two different peak wavelength red LEDs. FIG. 12A is a table identifying various chromaticity, gamut area, color rendering, and luminous efficacy characteristics of two BSY/G+R lighting devices each having 447 nm peak wavelength blue LED stimulating a LuAG/NYAG green/yellow phosphor mixture, in combination with red LEDs having different dominant wavelengths of 623 nm and 628 nm (corresponding to peak wavelengths of 627 nm and 636 nm), respectively, and FIG. 12B provides corresponding values for two BSY+R lighting devices each having a 444 nm peak wavelength blue LED stimulating a NYAG yellow phosphor, in combination with red LEDs having different dominant wavelengths of 623 nm and 628 nm (corresponding to peak wavelengths of 627 nm and 636 nm). Relative to the BSY+R devices, the BSY/G+R devices exhibit a lower CRI Ra, a lower R9 color rendering value, a higher Qg, and a higher S/P ratio. Although subjective testing of the BSY+R devices was not performed with observers such as performed of BSY/G+R devices (described in connection with FIGS. 4A-4C), projected assessments are provided in the bottom row of the BSY+R table based on the Qg values. FIG. 12C provides spectral diagrams including intensity versus wavelength for the lighting devices of FIGS. 12A and 12B. The BSY/G+R device exhibits a shorter wavelength phosphor (middle) peak and a taller red peak.

FIG. 13 is a table identifying various chromaticity, gamut area, color rendering, and luminous efficacy characteristics of five different lighting devices each including red LEDs with relatively long red peak wavelengths. The first source embodies a BSY/G+R device with blue and red peak wavelengths of 446 nm and 642 nm, respectively, providing a Qg value of 115.6 and a R9-prime value of 176.9 (with R9 value of 19.7). The second source embodies a Cree CXA BS(Y+R) device with blue and red peak wavelengths of 451 nm and 642 nm, respectively, providing a Qg value of 112 and a R9 value of 58.4. The third source embodies a BSY+R device with blue and red peak wavelengths of 444 nm and 636 nm, respectively, providing a Qg value of 114.5 and a R9 value of 60.9. The fourth source embodies a BSY/G+R device with blue and red peak wavelengths of 447 nm and 636 nm, respectively, providing a Qg value of 116.7 and a R9-prime value of 194.9 (with R9 value of 0.5). The fifth source embodies a BSY/G+R device with blue and red peak wavelengths of 446 nm and 643 nm, respectively, providing a Qg value of 119 and a R9-prime value of 222.41 (with R9 value of −32.8). FIG. 13 shows that longer wavelength red LEDs can increase Qg values for BSY+R devices in a manner similar to BSY/G+R devices, but Qg values are higher for BSY/G+R devices than BSY+R devices for comparable supplemental red LED wavelengths.

In certain embodiments, increased saturation (including but not limited to increased Qg) can be achieved or enhance with the use of relatively narrow spectral output green or yellow lumiphors. Such increased saturation may be instead of or in addition to a long wavelength LED as described previously herein. Use of narrow wavelength range green or yellow lumiphors in lieu of traditional wide wavelength range green or yellow lumiphors is believed to be run counter to conventional wisdom according to which higher CRI Ra is typically sought. Use of narrow wavelength range green lumiphors may result in reduced spectral content between peaks attributable to lumiphoric material and a red LED in a BSG+R device, thereby providing potential for increasing Qg.

In certain embodiments, a relatively narrow spectrum yellow or green lumiphor may include a peak wavelength preferably in a range of from 510 nm to 570 nm (or from 510 nm to 544 nm) and a full width-half maximum (FWHM) intensity value of less than 90 nm, of less than 80 nm, of less than 75 nm, of less than 70 nm, or of less than 65 nm. In certain embodiments, a narrow spectrum green lumiphor is preferred. One example of a narrow spectral output green lumiphor is BOSE (BG201B) phosphor having a peak wavelength of about 526 nm and a FWHM intensity value of about 68, relative to a FWHM intensity value of approximately 100 for GAL535 (a LuAG type green phosphor). Another example of a narrow spectral output green lumiphor includes green quantum dots, which are tiny particles or nanocrystals of light-emitting semiconductor materials.

FIG. 14A identifies various chromaticity, gamut area, color rendering, and luminous efficacy characteristics of a BSG+R LED lighting device including a narrow wavelength green lumiphor Such device includes a blue LED with a peak wavelength of 447 nm arranged to stimulate a BOSE (BG201B) green phosphor, with the device including a red LED having a peak wavelength of 647 nm. The resulting device included a CRI Ra value of 37.76, a Qg value of 130.5, a S/P ratio of 1.77, a R9 value of −169.8, and a R9-prime value of 355.6. FIG. 14B is a plot of chromaticities in CIE 1976 L*a*b* color space of multiple color patches used in the definition of Qg when illuminated with the BSG+R LED lighting device of FIG. 14A and when illuminated with a reference (blackbody) source. FIG. 14C provides a spectral diagram including intensity versus wavelength for the same lighting device.

To provide a basis for comparing FWHM values for different green phosphors, FIGS. 15A and 15B include a bar chart and numerical moments of spectral full width-half maximum for a BOSE green (BG201B) phosphor and GAL535 (LuAG type) green phosphor, respectively. Additionally, FIG. 15C is a line chart representing peak wavelengths for the phosphors of FIGS. 15A and 15B and for a GAL535:NYAG4 1:1 green:yellow phosphor mixture. The 1:1 mixture of green:yellow phosphor has a peak wavelength of 545 nm, which is 1 nm higher than the upper boundary of the 510 nm to 544 nm peak wavelength range selected for narrow wavelength range green phosphors used in devices according to certain embodiments. In certain embodiments, a narrow wavelength yellow or green phosphor comprising a peak wavelength in a yellow or green range of from 510 nm to 570 nm may be used.

FIG. 16 is a plot of color points for sources including blue LEDs of various wavelengths, BSY sources with 100% NYAG4 yellow phosphor, BSG sources with 100% GAL535 green phosphor, a BSG sources with 100% BG201B green phosphor, and GAL535:NYAG4 1:1 green:yellow phosphor mix sources, with addition of a dashed line offset above the data points for the sources with 100% GAL535 green phosphor. The dashed line represents a boundary above which conventional (wide FWHM) green phosphors are believed to be excluded. Thus, BSG color points above and to the left of the dashed line may be utilized in combination with red solid state emitters (e.g., LEDs) to obtain BSG+R devices having increased Qg. Qg may be still further enhanced by utilizing red solid state emitters of longer wavelengths as disclosed herein.

FIG. 17 is a CIE 1931 (x,y) chromaticity diagram illustrating the blackbody or Planckian locus, the spectrum locus, and a first dash-line closed shape with vertices A, C, D, and F that includes BSY/G subcombination color points produced by a blue solid state light emitter in combination with one or more lumiphoric materials as utilized in BSY/G+R lighting devices according to at least some embodiments of the present disclosure. Line segments "A-C" and "D-F" correspond to portions of the 5000K CCT and 2000K CCT tie lines, respectively. Curved line segment "A-F" corresponds to the spectrum locus between the 5000K CCT and 2000K CCT tie lines. Line segment "C-D" corresponds to a segment of the dashed line shown in FIG. 16. In certain embodiments, a combination of lumiphor emissions and unabsorbed portion of the blue LED emission of the BSY/G portion of a BSY/G+R device would, in the absence of any additional light, produce a mixture of light within the closed shape bounded by vertices A, C, D, and F, wherein segments A-C, C-D, and D-F embody straight lines and segment A-F embodies a curve corresponding to a portion of spectrum locus. Coordinates for points A, C, D, and F for one embodiment are identified in the following Table 1.

TABLE 1

| Embodiment | A (x,y) | C (x,y) | D (x,y) | F (x,y) |
| --- | --- | --- | --- | --- |
| (i) | (0.040, 0.329) | (0.257, 0.345) | (0.332, 0.551) | (0.020, 0.770) |

In other embodiments, one or more subregions of the preceding region may be defined wherein curved segment "A-F" may be shifted rightward by x values of 0.025, of 0.05, 0.075, 0.1, 0.125, or 0.15; wherein line segment A-F may be defined by a straight line between endpoints "A-F", or wherein line segment may be defined by a straight line parallel to a line drawn through existing line segment "A-F" but shifted rightward by x values of 0.025, 0.05, 0.75, 0.1, 0.125, or 0.15. In each of the preceding subregions, the vertices C and D remain unchanged. The preceding subregions define BSG subcombination color points of high Qg BSG+R devices according to certain embodiments.

It is known that Qg values generally decline with increasing CCT. To correlate Qg and CCT, production data over a 25 day period was obtained for LED lighting devices having different nominal CCT values. Average Qg values at 3000K, 3500K, 4000K, and 5000K were about 102.5, 100.9, 99.2, and 96.2, respectively. A functional relationship of $112-(0.003 \times CCT)$ was established for this baseline. Embodiments according to the present disclosure are believed to be capable of providing Qg values exceeding the preceding baseline by at least 7 points, at least 8 points, at least 9 points, at least 10 points, at least 11 points, or at least 12 points over a range of CCT values spanning at least from 2000K to 5000K (or from 2000K to 6500K in certain embodiments). Thus, in certain embodiments, minimum Qg values may be increased from 7 to 12 points relative to the preceding equation, such that lighting devices disclosed herein may include aggregate emissions having Qg values of at least the values defined by one or more of the following equations: (i) at least $119-(0.003 \times CCT)$; (ii) at least $120-(0.003 \times CCT)$; (iii) at least $121-(0.003 \times CCT)$; (iv) at least $122-(0.003 \times CCT)$; (v) at least $123-(0.003 \times CCT)$; and (vi) (v) at least $124-(0.003 \times CCT)$. In certain embodiments, lighting devices may include aggregate emissions with Qg values of at least 115, of at least 119, at least 120, at least 122, at least 125, at least 127, and at least 130. In certain embodiments, the preceding thresholds may be obtained at at least one CCT value within the range of from 200K to 6500K, from 2000K to 5000K, from 2500K to 5000K, or from 2500K to 4500K.

Lighting devices according to certain embodiments as disclosed herein may include R9-prime (R9') color rendering values of at least 101 (or greater than 100), at least 110, at least 120, at least 130, at least 140, at least 150, at least 160, at least 170, at least 180, at least 190, at least 200, at least 210, or at least 220. Subranges including any of the preceding values as endpoints are also contemplated.

Lighting devices according to certain embodiments as disclosed herein may include CRI Ra values in at least one of the following ranges: at least 80, at least 70, at least 60, at least 50, at least 40, at least 35, from 50 to 80, from 70 to 85, from 70 to 80, less than or equal to 80, and less than or equal to 70. It is to be recognized that when R9-prime values increase beyond 100, such values correspond to declining R9 values, such that existence of R9-prime values significantly greater than 100 tend to result in declining CRI Ra values. Subranges including any of the preceding values as endpoints are also contemplated.

Lighting devices according to certain embodiments as disclosed herein may include luminous efficacy (lumens per watt) values of at least 70, at least 80, at least 90, at least 95, at least 100, at least 110, at least 120, at least 130, at least 140, and at least 150. Subranges including any of the preceding values as endpoints are also contemplated.

In certain embodiments, at least some of the preceding thresholds for two, three, or four different parameters of Qg, CRI Ra, R9-prime color rendering, and luminous efficacy may be achieved in combination.

In certain embodiments, aggregate emissions of a BSY/G+R lighting device have a CCT in a range of from 2000K to 6500K, from 2000K to 5000K; from 2500K to 5000K; from 3000K to 5000K; or from 2700K to 4500K.

In certain embodiments, a lighting device may be devoid of any "unconverted" blue LED not arranged to stimulate a lumiphoric material. In certain embodiments, a lighting device may be devoid of any incandescent light emitting element, and be devoid of any notch filtering element. In certain embodiments, a light bulb or light fixture may include at least one lighting device as disclosed herein.

In certain embodiments, a lighting device comprises at least one first electrically activated solid state emitter arranged to generate first emissions comprising a dominant wavelength in a blue range; at least one lumiphoric material arranged to receive at least a portion of the first emissions and produce lumiphor emissions comprising a dominant wavelength in a green or yellow-green range; and at least one second electrically activated solid state emitter arranged to generate second emissions comprising a dominant wavelength in a red or red-orange range; wherein aggregate emissions of the lighting device include at least a portion of the first emissions, at least a portion of the lumiphor emissions, and at least a portion of the second emissions; wherein said aggregate emissions comprise a correlated color temperature (CCT) value, and prior to passage through any optionally present notch filtering element arranged to at least partially inhibit transmission of said aggregate emissions, said aggregate emissions comprise a relative gamut area (Qg) value of at least the value obtained by the equation 121 minus the product of 0.003 times the CCT value; and wherein the lighting device comprises at least one of the following features (a) to (e): (a) the at least one second electrically activated solid state emitter comprises a peak wavelength of at least 630 nm; (b) the at least one lumiphoric material comprises a lumiphor arranged to produce lumiphor emissions having a peak wavelength in a range of from 510 nm to 570 nm (or from 510 nm to 544 nm) and having a full width-half maximum intensity of less than 90 nm; (c) a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.257, 0.345), a second line having x, y endpoint coordinates of (0.257, 0.345) and (0.332, 0.551), a third line having x, y endpoint coordinates of (0.332, 0.551) and (0.020, 0.770), and a curve corresponding to a portion of the spectrum locus having x, y endpoint coordinates of (0.020, 0.770) and (0.040, 0.329); (d) said aggregate emissions comprise a R9-prime color rendering value that is greater than 110; and (e) said aggregate emissions comprise a R9-prime color rendering value that is at least the value obtained by the equation (9 times the Qg value) minus 873, wherein the R9-prime color rendering value is also greater than 100.

In certain embodiments, a lighting device as disclosed herein includes a first power line, wherein each of at least one first (e.g., blue) electrically activated solid state emitter and at least one second (e.g., red or red-orange) electrically activated solid state emitter is electrically connected to the first power line. In certain embodiments, a lighting device as disclosed herein includes at least one (or multiple) of the following features: a single leadframe is arranged to conduct electrical power to the at least one first electrically activated solid state emitter and the at least one second electrically activated solid state emitter; a single reflector is arranged to reflect at least a portion of light emanating from each of the at least one first electrically activated solid state emitter and the at least one second electrically activated solid state emitter; a single submount or mounting element supports the at least one first electrically activated solid state emitter and the at least one second electrically activated solid state emitter; a single lens is arranged to transmit at least a portion of light emanating from each of the at least one first electrically activated solid state emitter and the at least one second electrically activated solid state emitter; and a single diffuser is arranged to diffuse at least a portion of light emanating from each of the at least one first electrically activated solid state emitter and the at least one second electrically activated solid state emitter. In certain embodiments, multiple first electrically activated (e.g., blue) solid state emitters and multiple second electrically activated (e.g., red or red-orange) solid state emitters are present. In certain embodiments, multiple clusters of solid state emitters may be provided, wherein each cluster includes at least one first solid state emitter and at least one second solid state emitter.

Additionally, although various LEDs are described herein as "red," it is to be recognized that such term is intended to encompass and include "red-orange" LEDs unless specifically indicated to the contrary herein.

FIGS. 18A to 18C illustrate examples of solid state emitter (e.g., LED) packages that may be used to provide one or more solid state emitters of lighting devices according to certain embodiments of the present invention.

FIG. 18A illustrates an LED package 10 in which a LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material, such as a phosphor or other lumiphoric material. The entire assembly may be encapsulated in a clear protective resin 14, which may be molded in the shape of a lens to collimate the light emitted from the LED chip 12 and/or phosphor particles in the encapsulant material 16. At least some of the light emitted by the LED chip 12 over a first wavelength range (e.g., "primary light") may be received by the phosphor, which may responsively emit light over a second wavelength range (e.g., "secondary light"). The primary light emitted by the LED chip 12 may be partially or completely absorbed by the wavelength conversion material, such that the overall light output of the LED package 10 includes both the primary light emitted by the LED chip 12 and the secondary light emitted by the wavelength conversion material.

Another LED package 20 that may be used in some embodiments of the present invention is illustrated in FIG. 18B. Relative to the LED package 10 described above, the LED package 20 depicted in FIG. 18B may be more suited for high power operations which may generate more heat. In the LED package 20, an LED chip 22 is mounted onto a carrier, such as a printed circuit board (PCB) carrier 23. A metal reflector 24 mounted on the carrier 23 surrounds the LED chip 22 and reflects light emitted by the LED chip 22 away from the package 20. The metal reflector 24 is typically attached to the carrier 23 by means of a solder or epoxy bond. The reflector 24 also provides mechanical protection to the LED chip 22. One or more wirebond connections 11 are made between ohmic contacts on the LED chip 22 and electrical traces 25A, 25B on the carrier 23. The mounted LED chip 22 is covered with an encapsulant 26, which may provide environmental and/or mechanical protection to the chips while also acting as a lens. The encapsulant 26 includes at least one phosphor or other wavelength conversion material that absorbs at least some of the light emitted by the LED chip 22, and responsively emits light of a different wavelength.

Yet another LED package 30 that may be used in some embodiments of the present invention is illustrated in FIG. 18C. The LED package 30 includes an LED chip 32 mounted on a submount 34 to a carrier substrate 33. The carrier substrate 33 can include an alumina substrate and/or a metal core PCB carrier substrate. A reflector 44 attached to the carrier substrate 33 surrounds the LED chip 32 and defines an optical cavity 35 above the LED chip(s) 32. An encapsulant material 36, such as silicone, fills the optical cavity 35. The encapsulant material 36 further includes at least one phosphor (or other wavelength conversion material) that absorbs at least some of the light emitted by the LED chip 32, and responsively emits light of a different wavelength. The reflector 44 reflects light emitted by the LED chip 32 away from the package 30. The reflector 44 also includes an upwardly extending cylindrical sidewall 45 that defines a channel in which a lens 38 can be inserted. The lens 38 may be held in place by the encapsulant material 36, and can move up and down as the encapsulant material 36 expands and contracts due to heat cycling. The lens 38 may include a light-scattering lens that is configured to refract light emitted by the LED and the wavelength conversion material (e.g., a transparent lens body with light scattering particles such as $TiO_2$, $Al_2O_3$, $SiO_2$, etc., and/or a lens body including a roughened outer surface that can randomly scatter light that exits the lens 38).

FIGS. 19A-19E illustrate exemplary portions of solid state lighting devices incorporating electrically activated solid state emitters and lumiphoric materials, which may be used alone or in groups according to certain embodiments described herein. It is to be appreciated that various structures employed within complete lighting devices (e.g., package leads, leadframes, contacts, wirebonds, bond structures, heat transfer elements, light extracting optics, diffusers, additional reflecting surfaces, power supplies, and the like) have been omitted for clarity of illustration, but one skilled in the art would appreciate that known structures could be incorporated in operative lighting devices including the illustrative portions provided in FIGS. 19A-19E.

FIG. 19A is a side cross-sectional schematic view of a portion of a solid state lighting device 100 including at least one electrically activated solid state light emitter (e.g., LED) 104, a reflector cup 102 or other support structure on or over which the LED 104 is mounted, and (optionally) at least one lumiphor (e.g., phosphor) 107 dispersed in an encapsulant material disposed over the LED 104 and within the reflector cup 102. Although FIG. 19A illustrates the at least one lumiphor 107 as being dispersed in an encapsulant material, in various embodiments one or more lumiphors (e.g., phosphors) may be disposed in any suitable conformation to receive emissions from a solid state emitter (e.g., LED) and responsively re-emit light. In certain embodiments, at least one lumiphor may be coated directly on or over a solid state emitter. In certain embodiments, one or more lumiphors may be arranged in separate layers that may be spatially separated from each solid state emitter and/or one another. In certain embodiments, the device 100 including a lumiphor may be utilized in conjunction with a comparable device including a LED but lacking a lumiphor.

FIG. 19B is a side cross-sectional schematic view of a portion of a solid state lighting device 110 including at least one electrically activated solid state emitter (e.g., LED) 114, a reflector cup 112 or other support structure on or over which the solid state emitter 114 is mounted, and multiple lumiphors (e.g., phosphors) 118, 119 arranged in layers that are spatially segregated from the solid state emitter 114. An encapsulant 116 may be disposed between the solid state emitter 114 and the lumiphors 118, 119; alternatively, at least one void may be arranged between the solid state emitter 114 and the lumiphors 118, 119 to reduce conductive thermal coupling therebetween. In certain embodiments, the device 110 including at least one lumiphor may be utilized in conjunction with a comparable device including a LED but lacking a lumiphor.

FIG. 19C is a side cross-sectional schematic view of a portion of a solid state lighting device 120 including first and second solid state emitters (e.g., LEDs) 124, 125, a reflector cup 122 or other support structure on or over which the solid state emitters 124, 125 are mounted, and at least one lumiphor (e.g., phosphor) 127 dispersed in an encapsulant material disposed over the solid state emitters 124, 125 and within the reflector cup 122. In certain embodiments, multiple lumiphors 127 may be provided. In one embodiment, one or more lumiphors may be arranged to interact with only a single solid state emitter 124, 125. At least one lumiphor may be disposed in an amount (e.g., thickness, width, etc.) or concentration that varies with respect to position within a solid state lighting device, such embodied in variations of presence, amount or concentration with respect to one or more solid state emitters. For example, at least one lumiphor may be coated over or arranged over one solid state emitter, and not arranged over (or arranged in a different thickness or concentration over) another solid state emitter. In certain embodiments, the excitation (or stimulation) wavelength range of the lumiphor 127 may correspond with output wavelength range (e.g., at least overlapping with a full width half maximum output) of one LED 124, but not correspond with output wavelength range of another LED 125.

In certain embodiments, a solid state lighting device may include multiple electrically activated solid state emitters (e.g., LEDs) and one or more lumiphors (e.g., phosphors) arranged in one or more layers spatially separated from the solid state emitters. FIG. 19D is a side cross-sectional schematic view of a portion of a solid state lighting device 130 including first and second solid state emitters (e.g., LEDs) 134, 135, a reflector cup 132 or similar support structure on or over which the solid state emitters 134, 135 are mounted, and one or more lumiphors (e.g., phosphors) 138, 139 arranged in layers that are spatially segregated from the solid state emitters 134, 135. An encapsulant 136 or other material may be disposed between the solid state emitters 134, 135 and the lumiphors 138, 139; alternatively, the solid state emitters 134, 135 and lumiphors 138, 139 may be separated by a gap. In one embodiment, the lumiphors 138, 139 may be arranged in alternating layers including at least two non-adjacent layers including lumiphors of substantially the same material composition. One advantage of confining different lumiphors to different layers is to avoid undue absorption of emission spectrum of one lumiphor that may overlap with excitation spectrum of another lumiphor (e.g., excitation spectrum of a red phosphor may overlap with emission spectrum of a yellow phosphor) which would result in loss of efficiency. In certain embodiments, presence of a lumiphoric material may be non-uniform (e.g., patterned) within an individual lumiphor layer. In certain embodiments, a lumiphoric material layer may have a thickness that is non-uniform with respect to position.

FIG. 19E is a side cross-sectional schematic view of a portion of a solid state lighting device 140 including first and second electrically activated solid state emitters (LEDs) 144, 145, a reflector cup 142 or other support structure on or over which the LEDs 144, 145 are mounted, and at least one lumiphor 148 arranged to interact only (or primarily only) with a single LED 144. In certain embodiments, the at least one lumiphor 148 may be coated or deposited on or over a first LED 144 but omitted from the LED 145. In certain embodiments, the at least one lumiphor 148 may include a mixture of multiple lumiphors, and/or multiple layers of lumiphors having different material compositions. An encapsulant 146 may cover the LEDs 144, 145.

FIG. 20 illustrates a first light bulb 400 arranged to incorporate multiple solid state emitters as disclosed herein. The light bulb 400 may optionally be arranged to output notch filtered light. The solid state light bulb 400 includes a conventional power supply 404, and includes a heatsink 405 including fins to promote cooling of emitter chips 402 and power supply 404. A lateral contact 410 and foot contact 411 may be compatible with an Edison-style screw-type light socket for conducting power to the light bulb 400. An optical element 408 (which may be embodied in a light-transmissive globe) is provided to protect the emitter chips 402 and provide light shaping and/or diffusion utility for light emissions of the light bulb 400. One or more lumiphoric materials may be associated with the emitter chips 402 and/or the optical element 408 to provide wavelength conversion utility. In certain embodiments, one or more optional filtering materials (e.g., notch filtering materials) may be associated with the emitter chips 402 and/or the optical element 408 to filter light emissions in order to exhibit at least one spectral notch as described herein. If an optional notch filtering material is provided, then upon passage of light through one or more notch filtering materials (e.g., associated with LEDs and/or the optical element 408), the light will exhibit a spectral notch, and the notch filtering may be specifically tailored to increase GAI (or Qg) and/or CRI Ra.

FIG. 21 illustrates a second, reflector-type (i.e. PAR-style) light bulb 500 arranged to incorporate solid state emitters as disclosed herein. The light bulb 500 may optionally be arranged to output notch filtered light. The light bulb 500 includes a reflector 504 and an optical element (e.g., lens) 506 covering a front or light emitting portion of the bulb 500, with the reflector 504 and lens 506 together forming a light-transmissive optical enclosure. An opposing end of the bulb includes contacts 510, 511 (e.g., an Edison-style threaded lateral contact 510 and a foot contact 511) for receiving power from a socket or other receptacle. A body 508 of the light bulb 500 may include suitable LED control and/or drive circuitry. The bulb 500 includes LED devices or dies (not visible) as previously discussed, and such components optionally may include one or more notch filtering material layers and/or one or more lumiphoric materials. Optionally, one or more filtering materials (e.g., notch filtering materials) may be associated with the lens 506 to filter light emissions in order to exhibit at least one spectral notch as described herein. The lens 506 may alternatively or additionally include light scattering and/or lumiphoric materials in certain embodiments. If notch filtering material is provided, then upon passage of light through one or more notch filtering materials (e.g., associated with LEDs and/or the lens 506), the light will exhibit a spectral notch, and the notch filtering may be specifically tailored to increase GAI (or Qg) and/or CRI Ra.

FIGS. 22A-22B illustrate a troffer-type (in-ceiling linear) light fixture 700 arranged to incorporate multiple solid state emitters (e.g., LEDs) 726 as disclosed herein. One or more lumiphoric materials may be associated with one or more LEDs 726. Optionally, the fixture 700 may include one or more notch filtering materials, such as may be associated with LEDs 726, may be applied to or included in a linear reflector (e.g., e.g., by doping, impregnation, coating, etc.), or may be applied to or integrated with one or more light transmissive lens plates 715, 716 to cause the light emitted from the light fixture 700 to exhibit a spectral notch. Light fixture 700 includes pan 701, heatsink 702, emitter mounting surface 724, reflector 708, and end caps 710, 711. End cap 710 is larger than end cap 711 and is shaped to act as a circuit box to house electronics used to drive and control the light source (e.g., rectifiers, regulators, timing circuitry, etc.). Although a reflector may take various shapes, in the illustrated embodiment, the reflector 708 includes a flat region opposite the heatsink 702. In alternative embodiments, the reflector 708 could be parabolic in shape, or include two or more parabolic regions. Light fixture 700 also includes a diffuser lens assembly including lens plates 715, 716, disposed adjacent to sides of the heatsink 702. Reflector 708 can be made of many different materials, including metal, polymeric material, microcellular polyethyleneterephthalate (MCPET), or other suitable materials. If notch filtering material is provided, then emissions of the LEDs 726 may interact with one or more notch filtering materials (e.g., associated with the LEDs 726, associated with the reflector 708 (such as optional notch filtering material 718), and/or associated with the lens plates 715, 716) such that the light will exhibit a spectral notch, and the notch filtering may be specifically tailored to increase GAI (or Qg) and/or CRI Ra.

FIG. 23 illustrates a lighting apparatus (e.g., light fixture) 810 according to at least one embodiment. The apparatus 810 includes a substrate or mounting plate 875 to which multiple solid state emitter (e.g., LED) lamps 870-1 to 870-6 (optionally embodied in multi-chip lamps such as multi-chip LED packages) are attached, wherein each lamp 870-1 to 870-6 may include multiple LEDs as described herein. Each lamp 870-1 to 870-6 may optionally include a cluster of solid state emitters, including at least one lumiphor converted solid state emitter and at least one supplemental solid state emitter as disclosed herein. The mounting plate 875 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 870-1, each solid state lamp 870-1 to 870-6 may include multiple solid state emitters (e.g., LEDs) 864A-864D preferably arranged on a single submount 861. Although FIG. 23 illustrates four solid state emitter chips as being associated with each multi-chip solid state lamp 870-1 to 870-6, it is to be appreciated that any suitable number of solid state emitter chips may be associated with each multi-chip solid state lamp 870-1 to 870-6, and the number of solid state emitter chips associated with different (e.g., multi-chip) solid state lamps may be different. Each solid state lamp 870-1 to 870-6 in a single fixture 810 may be substantially identical to one another, or solid state lamps with different output characteristics may be intentionally provided in a single fixture 810.

The solid state lamps 870-1 to 870-6 may be grouped on the mounting plate 875 in clusters or other arrangements so that the light fixture 810 outputs a desired pattern of light. In certain embodiments, at least one state emitter lamp associated with a single fixture 810 includes a lumiphor-converted light emitting component. One or more lamps 870-1 to 870-6 may optionally include at least one notch filtering material. With continued reference to FIG. 23, the light fixture 810 may include one or more control circuit components 880 arranged to operate the lamps 870-1 to 870-6 by independently applying currents and/or adjusting duty cycle of respective LED components or groups thereof. In certain embodiments, individual solid state chips 864A-864D in various lamps 870-1 to 870-6 may be configured to be individually addressed by the control circuit 880. In certain embodiments, the lighting apparatus 810 may be self-ballasted. In certain embodiments, a control circuit 880 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 880 may be configured to control the current driven through the solid state emitter chips 864A-864D associated with the lamps 870-1 to 870-6 using one or more control schemes known in the art. The control circuit 880 may be attached to an opposite or back surface of the mounting plate 875, or may be provided in an enclosure or other structure (not shown) that is segregated from the light fixture 810.

While not illustrated in FIG. 23, the light fixture 810 may further include one or more heat spreading components and/or heatsinks for spreading and/or removing heat emitted by solid state emitter chips 864A-864D associated with the lamps 870-1 to 870-6. For example, a heat spreading component may include a sheet of thermally conductive material configured to conduct heat generated by the solid state emitter chips 864A-864D of the light fixture 810 and spread the conducted heat over the area of the mounting plate 875 to reduce thermal stratification in the light fixture 810.

FIG. 24A illustrates a solid state emitter package 900 including multiple solid state light emitters as described herein. The emitter package 900 includes multiple (e.g., four) LED chips 950A-950D that may be separately controlled (e.g., via backside anodes 921A-921D and cathodes 922A-922D shown in FIG. 24B) and that are supported by an insulating substrate 910. The substrate 910, which may preferably comprise a ceramic material, includes an upper surface 911, a lower surface 912, and side walls 913-916 extending between the upper surface 911 and the lower surface 912. Electrical traces 940 are arranged over the substrate 910, including multiple die attach pads 941A-941D and additional electrical elements 942A-942D arranged proximate to the die attach pads 941A-941D. Where the die attach pads 941A-941D are electrically conductive, the LED chips 950A-950D may be arranged with bottom side contacts thereof in electrical communication with the die attach pads 941A-941D, and with top side contacts thereof in electrical communication with the electrical elements 942A-942D by way of wirebonds 952. The die attach pads 941A-941D and electrical elements 942A-942D may comprise one or more metals patterned on (or in) the upper surface 911 of the substrate 910. Gaps 945 may be provided between adjacent die attach pads 941A-941D and/or electrical elements 942A-942D to prevent undesired conductive electrical communication. In certain embodiments, die attach pads need not be electrically conductive, such as in cases where anode and cathode connections to a solid state emitter chip are both made with wirebonds. An insulating soldermask 947 is patterned over peripheral portions of the electrical traces 940, and a molded lens 960 (e.g., including a raised or hemispherical portion 961 and a base portion 962) is arranged over the upper surface 911 of the substrate 910 and is arranged to transmit at least a portion of light generated by the LED chips 950A-950D.

LED chips 950A-950D of any suitable peak wavelength (e.g., color) may be used, and one, some, or all of the LED chips 950A-950D may be arranged to stimulate emissions of one or more lumiphors (e.g., phosphors). Although some or all of the LED chips 950A-950D may be separately controlled, in certain embodiments groups of two or more LED chips 950A-950D or groups of LED chips may be controlled together in a groupwise fashion. For example, in certain embodiments a first group of LED chips 950A-950B may be controlled as a first group, and a second group of LED chips 950C-950D may be controlled as a second group. In certain embodiments, one or more LED chips of each group may be separately or collectively arranged to stimulate emissions of at least one lumiphoric material, which may be arranged directly on a LED chip, or spatially segregated from each LED chip. In certain embodiments, a first group of LED chips may be arranged to output aggregate emissions having a first Qg value, and a second group of LED chips may be arranged to output aggregate emissions having a second Qg value. By independently applying currents and/or adjusting duty cycle of the respective LED groups, Qg value for total emissions of the emitter package 900 may be adjusted, and high Qg values may be obtained. In certain embodiments, the emitter package 900 may include Qg values and combinations of emitters and/or lumiphors as disclosed herein. Although four LED chips 950A-950D are illustrated in FIG. 24A, it is to be appreciated that a LED package may include any desirable number of LED chips, including groups of chips arranged in series, in parallel, or in series-parallel configurations.

FIG. 24B is a bottom plan view of the emitter package 900 of FIG. 24A. A lower surface 912 of the substrate includes four anodes 921A-921D and four cathodes 922A-922D patterned thereon (e.g., as electrical traces), with one paired anode/cathode per quadrant. The separate anodes 921A-921D and cathodes 922A-922D enable separate control of the multiple solid state emitters (e.g., LED chips) 950A-950B, if desired. The various anodes 921A-921D and cathodes 922A-922D are separated by gaps that may be filled with solder mask material sections 927-1, 927-2. A thermal element (e.g., thermal spreading element) 926 may be arranged along the bottom surface 912 between the solder mask material sections 927-1, 927-2 and generally underlapping the LED chips 950A-950D. The thickness of the thermal element 926 may be the same as or different from (e.g., thicker than) the anodes 921A-921D and cathodes 922A-922D. As shown, the package 900 is devoid of any anode or cathode arranged on, or extending laterally beyond, any side wall 913-916 thereof. Although the emitter package 900 is illustrated as including anodes and cathodes on the lower surface 912, it is to be recognized that emitter packages according to different embodiments may include anodes and/or cathodes arranged on or extending from upper surfaces or side surfaces of an emitter package. Additionally, emitter packages according to different embodiments may include various control circuit and/or drive circuit elements arranged in or on a substrate that is also arranged to support one or more LED chips.

FIGS. 25A-25C embody a table identifying gamut area, color rendering, and luminous efficacy characteristics of 138 modeled solid state lighting devices at CCT values of 4000K including various combinations of solid state emitters and/or phosphors, sorted from high to low Qg values. The column labeled "Source 1" identifies red LEDs except where "CASN" (red phosphor) is specified. The column labeled "Source 2" identifies either green LEDs, LuAG green phosphor, NYAG yellow phosphor, or mixtures of LuAg and NYAG (e.g., in a ratio of 5:1 or 7:1). The column labeled "Source 3" identifies various blue LEDs. Adjacent to each source column, a dominant wavelength, peak wavelength, and % lumens of the respective source is further provided. The rightmost ten columns provide scotopic/photopic ratio, modeled luminous efficacy LPW* (wherein it is noted that the indicated LPW* values are useful for relative comparison within FIGS. 25A-25C and 26A-26C, but not necessarily indicative of absolute lumens per watt values), luminous efficacy ratio (LER) (equal to total photopic luminous flux over total radiant power), R9 color rendering, color quality scale (CQS), GAI, qf, Qg, and power (W). As shown in FIG.

25A, the seventeen emitters with highest Qg values include green LEDs as Source 2. Rows 18 and 19 indicate that sources with LuAG green phosphors, long peak wavelength red LEDs (641 nm), and blue LEDs (444 and 452 nm peak wavelengths) may provide Qg values of 120 and CRI values of greater than 70 at a CCT of 4000K. Similar Qg values may be obtained with devices including 5:1 or 7:1 LuAg:NYAG green:yellow phosphor blends stimulated by blue LEDs in combination with long peak wavelength red LEDs.

FIGS. 26A-26C embody a table identifying gamut area, relative gamut, color rendering, and luminous efficacy characteristics of modeled BSY+R, BSG+R, and BSY/G+R solid state lighting devices at various CCT values from 2700K to 6500K. From the left, the labeled columns of FIGS. 26A-26C represent target CCT, actual CCT, Duv from the blackbody locus, luminous efficacy of radiation, scotopic/photopic ratio, CRI, R9 color rendering, color quality scale, gamut area index, qf, Qg, modeled luminous efficacy (LPW*, wherein it is noted that the indicated LPW* values are useful for relative comparison within FIGS. 25A-25C and 26A-26C, but not necessarily indicative of absolute lumens per watt values), identifiers for the first to third sources, and dominant wavelengths, peak wavelengths, and percentage lumens for the respective sources. It can be observed from FIGS. 26A-26C that short wavelength blue LEDs (e.g., 440 nm peak wavelength) can beneficially enhance Qg relative to longer wavelength blue LEDs. It can be further observed from FIGS. 26A-26C that elevated Qg values can be obtained for devices having elevated CCT values such as at 5700K (see rows 11, 22, 24, 28, 40, 46, 52, 55, 72 with Qg values of 110.6, 112.6, 111.3, 111.8, 113.3, 111.8, 112.3, 117.0, and 116.1, respectively), and 6500K (see rows 36 and 71 with Qg values of 109.1 and 112.9, respectively). Such elevated Qg values may also be attained in conjunction with acceptably high CRI values.

In certain embodiments, elevated Qg values can be obtained with solid state light emitting devices that include at least one electrically activated solid state light emitter arranged to stimulate emissions of (i) at least one first lumiphoric material arranged to produce lumiphor emissions comprising a dominant wavelength in a green or yellow range and (ii) at least one second lumiphoric material comprising a relatively narrow spectral output (e.g., a narrow full width-half maximum (FWHM) intensity value). In certain embodiments, at least one second lumiphoric material comprises a red phosphor arranged to produce emissions including at least one peak having a FWHM value of preferably less than 75 nm, less than 60 nm, less than 50 nm, less than 40 nm, less than 30 nm, less than 20 nm, less than 10 nm, or less than 5 nm. Such values differ from typical red phosphors, which have FWHM values of at least 75 nm. In certain embodiments, at least one second lumiphoric material comprises a red phosphor including multiple peaks (e.g., at least two or at least three) each having FWHM values of preferably less than 20 nm, less than 10 nm, or less than 5 nm. In certain embodiments, at least one second lumiphoric material comprises one or more red quantum dot materials. Typical red quantum dot materials include FWHM values of 40 nm or less. Preferably, the at least one second lumiphoric material comprises a relatively long peak wavelength (e.g., at least 619 nm, at least 622 nm, at least 626 nm, at least 631 nm, at least 635 nm, or another value specified herein, with any of the preceding ranges optionally bounded by an upper limit of 640 nm, or 650 nm).

FIGS. 27 and 28 are directed to an embodiment utilizing red quantum dot materials. FIG. 27 provides a spectral diagram including intensity versus wavelength obtained by simulation of a lighting device including a blue LED having a 450 nm dominant wavelength arranged to stimulate emissions of (i) a 2:1 green:yellow mixture of GAL535/NYAG phosphors and (ii) at least one red quantum dot material. FIG. 28 is a table identifying Qg and CRI for a simulated device according to FIG. 27 as a function of red quantum dot peak wavelength at CCT values of 3000K and 4000K, respectively. FIG. 28 indicates that a Qg values in excess of 110 can be obtained at CCT values of 3000K or 4000K for such a device incorporating quantum dots having peak wavelengths in a range of from 626 nm to 650 nm. Additionally, relatively high CRI values of at least 80 may be obtained simultaneously with Qg values in excess of 110 at 3000K utilizing quantum dots having peak wavelengths of 626 nm or 631 nm, and relatively high CRI values of at least 80 may be obtained simultaneously with Qg values in excess of 110 at 4000K utilizing quantum dots having peak wavelengths of 626, 631, 635, 639, 641, or 643 nm.

In certain embodiments, a solid state lighting device includes at least one first electrically activated solid state emitter arranged to generate first emissions comprising a dominant wavelength in a blue range; at least one first lumiphoric material arranged to receive at least a portion of the first emissions and produce first lumiphor emissions comprising a dominant wavelength in a green or yellow-green range; at least one second lumiphoric material arranged to receive at least a portion of the first emissions and produce second lumiphor emissions comprising a dominant wavelength in a red range; wherein aggregate emissions of the lighting device include at least a portion of the first emissions, at least a portion of the first lumiphor emissions, and at least a portion of the second lumiphor emissions; wherein said aggregate emissions comprise a correlated color temperature (CCT) value, and said aggregate emissions comprise a relative gamut area (Qg) value of at least 110 (preferably in combination with a CRI value of at least 80); wherein the at least one second lumiphoric material comprises a red quantum dot material arranged to produce lumiphor emissions having a peak wavelength in a range of from 620 nm to 650 nm (or from 625 nm to 650 nm, or from 630 nm to 650 nm, with any of the preceding subranges optionally bounded by an upper limit of 635 nm, 640 nm, or 650 nm). Such Qg threshold may be obtained at different CCTs using red quantum dot materials of different peak wavelengths. In certain embodiments, Qg values of at least 110 may be attained for CCT values in a range of less than 4000K (e.g., including but not limited to a range of from 3000K to 4000K), or above 4000K. As longer red peak wavelengths are used, however, luminous efficacy and color rendering properties generally suffer.

FIGS. 29A, 29B, and 30 are directed to an embodiment utilizing a narrow wavelength red phosphor. One example of a narrow wavelength output red phosphor suitable for excitation from blue light is Mn doped potassium fluoro titanate (acronym "PFT") disclosed in U.S. Pat. No. 7,497,973, which is hereby incorporated by reference herein. In certain embodiments, a narrow wavelength output red phosphor has a FWHM value of preferably less than 90 nm, less than 80 nm, less than 75 nm, or another range specified herein.

FIG. 29A is a table identifying Qg and CRI values as a function of CCT (for seven CCT values spanning from 2500K to 5000K) for a simulated lighting device including a blue LED (450 nm dominant wavelength) arranged to stimulate emissions of both a NYAG (yellow) phosphor and a red phosphor having a relatively narrow spectral output. FIG. 29B is a scatter plot of Qg as a function of CCT for the simulated lighting device of FIG. 29A, with a superimposed best fit line for the plotted points. The best fit line conforms to the following linear equation:

$$Qg = 129.35 - (0.0058 \text{ times CCT})$$

In certain embodiments, a minimum Qg value may be reduced by one or two points relative to the functional relationship set out above. FIG. 29A shows that elevated Qg values can be obtained in conjunction with relatively high CRI (e.g., at least 80) for CCT values in a range of from 2500K to 4000K with a blue shifted (yellow plus red) lighting device that is devoid of a red solid state light emitter.

In certain embodiments, a solid state lighting device includes at least one first electrically activated solid state emitter arranged to generate first emissions comprising a dominant wavelength in a blue range; at least one first lumiphoric material arranged to receive at least a portion of the first emissions and produce first lumiphor emissions comprising a dominant wavelength in a green or yellow-green range; at least one second lumiphoric material arranged to receive at least a portion of the first emissions and produce second lumiphor emissions comprising a dominant wavelength in a red range; wherein aggregate emissions of the lighting device include at least a portion of the first emissions, at least a portion of the first lumiphor emissions, and at least a portion of the second lumiphor emissions; wherein said aggregate emissions comprise a correlated color temperature (CCT) value, and said aggregate emissions comprise a relative gamut area (Qg) value of at least the value obtained by the equation 127.35 minus the product of 0.0058 times the CCT value (or 128.35 minus the product of 0.0058 times the CCT value, or 129.35 minus the product of 0.0058 times the CCT value); wherein the at least one second lumiphoric material comprises a lumiphor arranged to produce lumiphor emissions having a peak wavelength in a range of from 620 nm to 650 nm (or from 625 nm to 650 nm, or from 630 nm to 650 nm).

FIG. 30 is a table identifying Qg and CRI values as a function of CCT (for three CCT values spanning from 2700K to 3500K) for a simulated lighting device including a blue LED (452 nm dominant wavelength) arranged to stimulate emissions of both a GAL535 (LuAG type) green phosphor and a red phosphor having a relatively narrow spectral output. Such table shows that relatively high Qg values may be obtained with a green phosphor and narrow wavelength output red phosphor stimulated by a blue LED, but such values are lower than the Qg values (in conjunction with lower CRI values) obtained with the yellow phosphor and narrow wavelength output red phosphor stimulated by a blue LED according to FIGS. 29A-29B.

Unless indicated to the contrary, any one or more embodiments disclosed herein may be implemented in any suitable light emitting apparatus, such as a solid state emitter package (optionally including multiple anodes and multiple cathodes to permit independent control of at least two emitters or emitter groups), a light bulb, a light fixture, or the like.

Embodiments as disclosed herein may provide one or more of the following beneficial technical effects: enhancing perceived quality of emissions of lighting devices; enhancing vividness of colors represented by lighting devices; enhancing vividness of illuminated red objects; and enhancing efficacy of vivid output lighting devices.

While the invention has been has been described herein in reference to specific aspects, features, and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A lighting device comprising:
at least one first electrically activated solid state emitter arranged to generate first emissions comprising a dominant wavelength in a blue range;
at least one lumiphoric material arranged to receive at least a portion of the first emissions and produce lumiphor emissions comprising a dominant wavelength in a green or yellow-green range; and
at least one second electrically activated solid state emitter arranged to generate second emissions comprising a dominant wavelength in a red or red-orange range;
wherein aggregate emissions of the lighting device include at least a portion of the first emissions, at least a portion of the lumiphor emissions, and at least a portion of the second emissions;
wherein said aggregate emissions comprise a correlated color temperature (CCT) value, and said aggregate emissions comprise a relative gamut area (Qg) value of at least the value obtained by the equation 121 minus the product of 0.003 times the CCT value; and
wherein the lighting device comprises at least one of the following features (a) to (c):
(a) a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.257, 0.345), a second line having x, y endpoint coordinates of (0.257, 0.345) and (0.332, 0.551), a third line having x, y endpoint coordinates of (0.332, 0.551) and (0.020, 0.770), and a curve corresponding to a portion of the spectrum locus having x, y endpoint coordinates of (0.020, 0.770) and (0.040, 0.329);
(b) said aggregate emissions comprise a R9-prime color rendering value that is greater than 110; or
(c) said aggregate emissions comprise a R9-prime color rendering value that is at least the value obtained by the equation (9 times the Qg value) minus 873, wherein the R9-prime color rendering value is also greater than 100.

2. The lighting device of claim 1, wherein said aggregate emissions comprise a relative gamut area (Qg) value of at least the value obtained by the equation 121 minus the product of 0.003 times the CCT value prior to passage through any optionally present notch filtering element arranged to at least partially inhibit transmission of said aggregate emissions.

3. The lighting device of claim 1, wherein the at least one second electrically activated solid state emitter comprises a peak wavelength of at least 630 nm.

4. The lighting device of claim 1, wherein the at least one lumiphoric material comprises a lumiphor arranged to produce lumiphor emissions having a peak wavelength in a range of from 510 nm to 570 nm and having a full width-half maximum intensity of less than 90 nm.

5. The lighting device of claim 1, wherein the at least one lumiphoric material comprises a lumiphor arranged to produce lumiphor emissions having a peak wavelength in a range of from 510 nm to 544 nm and having a full width-half maximum intensity of less than 80 nm.

6. The lighting device of claim 1, wherein a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.257, 0.345), a second line having x, y endpoint coordinates of (0.257, 0.345) and (0.332, 0.551), a third line having x, y endpoint coordinates of (0.332, 0.551) and (0.020, 0.770), and a curve corresponding to a portion of the spectrum locus having x, y endpoint coordinates of (0.020, 0.770) and (0.040, 0.329).

7. The lighting device of claim 1, wherein said aggregate emissions comprise a R9-prime color rendering value that is greater than 110.

8. The lighting device of claim 1, wherein said aggregate emissions comprise a R9-prime color rendering value that is at least the value obtained by the equation (9 times the Qg value) minus 873, wherein the R9-prime color rendering value is also greater than 100.

9. The lighting device of claim 1, wherein said lighting device is devoid of a notch filtering element arranged to at least partially inhibit transmission of said aggregate emissions.

10. The lighting device of claim 1, wherein said aggregate emissions comprise a correlated color temperature (CCT) value in a range of from 2000K to 6500K.

11. The lighting device of claim 1, wherein said aggregate emissions comprise a Qg value of at least 115.

12. The lighting device of claim 1, wherein said aggregate emissions comprise a R9-prime color rendering value of at least 125.

13. The lighting device of claim 12, wherein said R9-prime color rendering value is at least 175.

14. The lighting device of claim 12, wherein said Qg value is at least 115, and said R9-prime color rendering value is at least 150.

15. The lighting device of claim 1, wherein said aggregate emissions comprise a color point within a 5-step MacAdam ellipse of the blackbody locus on a 1931 CIE Chromaticity Diagram.

16. The lighting device of claim 1, wherein said first emissions comprise a peak wavelength not exceeding 465 nm.

17. The lighting device of claim 1, wherein said second emissions comprise a peak wavelength in a range of from 510 nm to 544 nm.

18. The lighting device of claim 1, wherein said aggregate emissions comprise a CRI Ra value in a range of from 70 to 85.

19. The lighting device of claim 1, wherein said aggregate emissions comprise a CRI Ra value of less than or equal to 80.

20. The lighting device of claim 1, wherein said aggregate emissions of the lighting device comprise a luminous efficacy of at least 80 lumens per watt.

21. The lighting device of claim 1, wherein said aggregate emissions of the lighting device comprise a luminous efficacy of at least 95 lumens per watt.

22. The lighting device of claim 1, wherein:
said at least one lumiphoric material comprises a first lumiphoric material including at least one of lutetium aluminum garnet (LuAG) and green aluminate (GAL) material; and
said at least one lumiphoric material comprises a second lumiphoric material including cerium(III)-doped yttrium aluminum garnet (Ce:YAG) material;
wherein a proportion of the first lumiphoric material to the second lumiphoric material is at least 1:1.

23. The lighting device of claim 22, wherein a proportion of the first lumiphoric material to the second lumiphoric material is at least 1.5:1.

24. The lighting device of claim 22, wherein a proportion of the first lumiphoric material to the second lumiphoric material is at least 2:1.

25. The lighting device of claim 1, further comprising a first power line, wherein each of the at least one first electrically activated solid state emitter and the at least one second electrically activated solid state emitter is electrically connected to the first power line.

26. The lighting device of claim 1, comprising at least one of the following features:
a single leadframe arranged to conduct electrical power to the at least one first electrically activated solid state emitter and the at least one second electrically activated solid state emitter;
a single reflector arranged to reflect at least a portion of light emanating from each of the at least one first electrically activated solid state emitter and the at least one second electrically activated solid state emitter;
a single submount or mounting element supporting the at least one first electrically activated solid state emitter and the at least one second electrically activated solid state emitter;
a single lens arranged to transmit at least a portion of light emanating from each of the at least one first electrically activated solid state emitter and the at least one second electrically activated solid state emitter; or
a single diffuser arranged to diffuse at least a portion of light emanating from each of the at least one first electrically activated solid state emitter and the at least one second electrically activated solid state emitter.

27. The lighting device of claim 1, wherein the at least one first electrically activated solid state emitter comprises a plurality of first electrically activated solid state emitters, and the at least one second electrically activated solid state emitter comprises a plurality of second electrically activated solid state emitters.

28. The lighting device of claim 27, comprising a plurality of clusters of solid state emitters, wherein each cluster of the plurality of clusters includes at least one electrically activated solid state emitter of the plurality of first electrically activated solid state emitters and at least one electrically activated solid state emitter of the plurality of second electrically activated solid state emitters.

29. The lighting device of claim 1, being devoid of any electrically activated solid state emitter arranged to generate emissions (i) having a dominant wavelength in a range of from 430 nm to 480 nm and (ii) exiting the lighting device without passage through a layer or region comprising a lumiphoric material.

30. The lighting device of claim 1, being devoid of any incandescent light emitting element.

31. A light bulb or light fixture comprising the lighting device of claim 1.

32. A lighting device comprising:
   at least one first electrically activated solid state emitter arranged to generate first emissions comprising a dominant wavelength in a blue range;
   at least one lumiphoric material arranged to receive at least a portion of the first emissions and produce lumiphor emissions comprising a dominant wavelength in a green or yellow range; and
   at least one second electrically activated solid state emitter arranged to generate second emissions comprising a dominant wavelength in a red or red-orange range;
   wherein aggregate emissions of the lighting device include at least a portion of the first emissions, at least a portion of the lumiphor emissions, and at least a portion of the second emissions;
   wherein said lighting device is devoid of a notch filtering element arranged to at least partially inhibit transmission of said aggregate emissions; and
   wherein said aggregate emissions comprise a correlated color temperature (CCT) value, and said aggregate emissions comprise a relative gamut area (Qg) value of at least the value obtained by the equation 121 minus the product of 0.003 times the CCT value; and
   wherein the lighting device comprises at least one of the following features (a) to (c):
   (a) a combination of (A) the lumiphor emissions and (B) an unabsorbed portion of the first emissions transmitted through or past the at least one lumiphoric material would, in the absence of any additional light, produce a mixture of light having a color point on a 1931 CIE Chromaticity Diagram including x, y coordinates that define a point on or within a closed shape bounded by a first line having x, y endpoint coordinates of (0.040, 0.329) and (0.257, 0.345), a second line having x, y endpoint coordinates of (0.257, 0.345) and (0.332, 0.551), a third line having x, y endpoint coordinates of (0.332, 0.551) and (0.020, 0.770), and a curve corresponding to a portion of the spectrum locus having x, y endpoint coordinates of (0.020, 0.770) and (0.040, 0.329);
   (b) said aggregate emissions comprise a R9-prime color rendering value that is greater than 110; or
   (c) said aggregate emissions comprise a R9-prime color rendering value that is at least the value obtained by the equation (9 times the Qg value) minus 873, wherein the R9-prime color rendering value is also greater than 100.

33. A lighting device comprising:
   at least one first electrically activated solid state emitter arranged to generate first emissions comprising a dominant wavelength in a blue range;
   at least one first lumiphoric material arranged to receive at least a portion of the first emissions and produce first lumiphor emissions comprising a dominant wavelength in a green or yellow-green range; and
   at least one second lumiphoric material arranged to receive at least a portion of the first emissions and produce second lumiphor emissions comprising a dominant wavelength in a red range;
   wherein aggregate emissions of the lighting device include at least a portion of the first emissions, at least a portion of the first lumiphor emissions, and at least a portion of the second lumiphor emissions;
   wherein said aggregate emissions comprise a correlated color temperature (CCT) value; and
   wherein the lighting device comprises one of the following features (i) and (ii):
   (i) the at least one second lumiphoric material comprises a phosphor arranged to produce lumiphor emissions having at least one peak wavelength in a range of from 620 nm to 650 nm and a full width-half maximum intensity value of less than 60 nm, and said aggregate emissions comprise a relative gamut area (Qg) value of at least the value obtained by the equation 127.35 minus the product of 0.0058 times the CCT value prior to passage through an optionally present notch filtering element arranged to at least partially inhibit transmission of said aggregate emissions; or
   (ii) the at least one second lumiphoric material comprises a red quantum dot material arranged to produce lumiphor emissions having a peak wavelength in a range of from 620 nm to 650 nm, and said aggregate emissions comprise a relative gamut area (Qg) value of at least 110 prior to passage through an optionally present notch filtering element arranged to at least partially inhibit transmission of said aggregate emissions.

34. The lighting device of claim 33, wherein the at least one second lumiphoric material is arranged to produce lumiphor emissions having a peak wavelength in a range of from 625 nm to 645 nm.

35. The lighting device of claim 33, comprising feature (i).

36. The lighting device of claim 35, wherein the phosphor is arranged to produce emissions including multiple peak wavelengths in a range of from 620 nm to 650 nm, wherein each peak wavelength of the multiple peak wavelengths includes a full width-half maximum intensity value of less than 20 nm.

37. The lighting device of claim 33, comprising feature (ii).

38. The lighting device of claim 37, wherein said aggregate emissions comprise a relative gamut area (Qg) value of at least the value obtained by the equation 129.35 minus the product of 0.0058 times the CCT value.

39. The lighting device of claim 33, wherein said aggregate emissions embody a color rendering index value of at least 80.

40. A light bulb comprising:
   a lighting device according to claim 33, embodied in an emitter package including the at least one first electrically activated solid state emitter, the at least one first lumiphoric material, and the at least one second lumiphoric material; and
   a light-transmissive optical enclosure bounded by a light-transmissive lens or globe and containing the lighting device.

* * * * *